(12) United States Patent
Achtenberg et al.

(10) Patent No.: US 10,403,377 B2
(45) Date of Patent: Sep. 3, 2019

(54) NON-VOLATILE STORAGE WITH ADAPTIVE REDUNDANCY

(71) Applicant: WESTERN DIGITAL TECHNOLOGIES, INC., San Jose, CA (US)

(72) Inventors: Stella Achtenberg, Netanya (IL); Eran Sharon, Rishon Lezion (IL); Judah Gamliel Hahn, Ofra (IL); Omer Fainzilber, Even Yehuda (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 183 days.

(21) Appl. No.: 15/633,479

(22) Filed: Jun. 26, 2017

(65) Prior Publication Data

US 2018/0374548 A1 Dec. 27, 2018

(51) Int. Cl.
*G06F 12/02* (2006.01)
*G11C 16/34* (2006.01)
*G11C 16/04* (2006.01)
*G11C 16/08* (2006.01)

(52) U.S. Cl.
CPC ...... *G11C 16/3418* (2013.01); *G06F 12/0246* (2013.01); *G11C 16/0466* (2013.01); *G11C 16/0483* (2013.01); *G11C 16/08* (2013.01); *G06F 2212/2022* (2013.01)

(58) Field of Classification Search
CPC .............................................. G06F 2212/2022
See application file for complete search history.

(56) References Cited

U.S. PATENT DOCUMENTS

| | | | | |
|---|---|---|---|---|
| 2009/0070651 A1* | 3/2009 | Diggs | ................. | G06F 11/1068 714/752 |
| 2009/0183052 A1* | 7/2009 | Kanno | ................. | G06F 11/1068 714/763 |
| 2010/0088557 A1* | 4/2010 | Weingarten | ......... | G06F 11/1068 714/704 |
| 2011/0066902 A1* | 3/2011 | Sharon | ................. | G11C 16/349 714/721 |
| 2011/0307758 A1* | 12/2011 | Fillingim | ............ | G06F 11/1048 714/758 |
| 2013/0007343 A1* | 1/2013 | Rub | ..................... | G06F 12/0246 711/103 |

(Continued)

OTHER PUBLICATIONS

Achtenberg et al., Employing ECCs via Overprovisioning to Improve Flash Reliability: A New, Cost Efficient Approach, Advanced Memory Solutions, Flash Memory Summit, pp. 1-29, Mar. 8, 2016.

*Primary Examiner* — Mano Padmanabhan
*Assistant Examiner* — William E. Baughman
(74) *Attorney, Agent, or Firm* — Vierra Magen Marcus LLP

(57) ABSTRACT

A non-volatile storage apparatus includes a set of non-volatile memory cells, one or more control circuits in communication with the set of non-volatile memory cells, the one or more control circuits are configured to encode data with a code rate prior to storage in the set of non-volatile memory cells, the code rate selected from two or more code rates according to one or more predictive indicators received with the data, the one or more predictive indicators relating to expected conditions for storage of the data in the set of non-volatile memory cells.

20 Claims, 17 Drawing Sheets

(56) References Cited

U.S. PATENT DOCUMENTS

| | | | |
|---|---|---|---|
| 2013/0179753 A1* | 7/2013 | Flynn | G06F 12/0253 |
| | | | 714/773 |
| 2013/0219108 A1* | 8/2013 | Yang | G06F 11/1068 |
| | | | 711/103 |
| 2014/0136883 A1* | 5/2014 | Cohen | G06F 11/2094 |
| | | | 714/6.11 |
| 2014/0245108 A1* | 8/2014 | Gaertner | G06F 11/1008 |
| | | | 714/773 |
| 2014/0351486 A1 | 11/2014 | Baryudin | |
| 2015/0339186 A1* | 11/2015 | Sharon | H03M 13/1108 |
| | | | 714/760 |
| 2016/0110249 A1* | 4/2016 | Orme | G06F 12/0238 |
| | | | 714/6.24 |
| 2016/0342345 A1* | 11/2016 | Kankani | G06F 3/0616 |
| 2017/0102899 A1* | 4/2017 | Post | G06F 3/0644 |

* cited by examiner

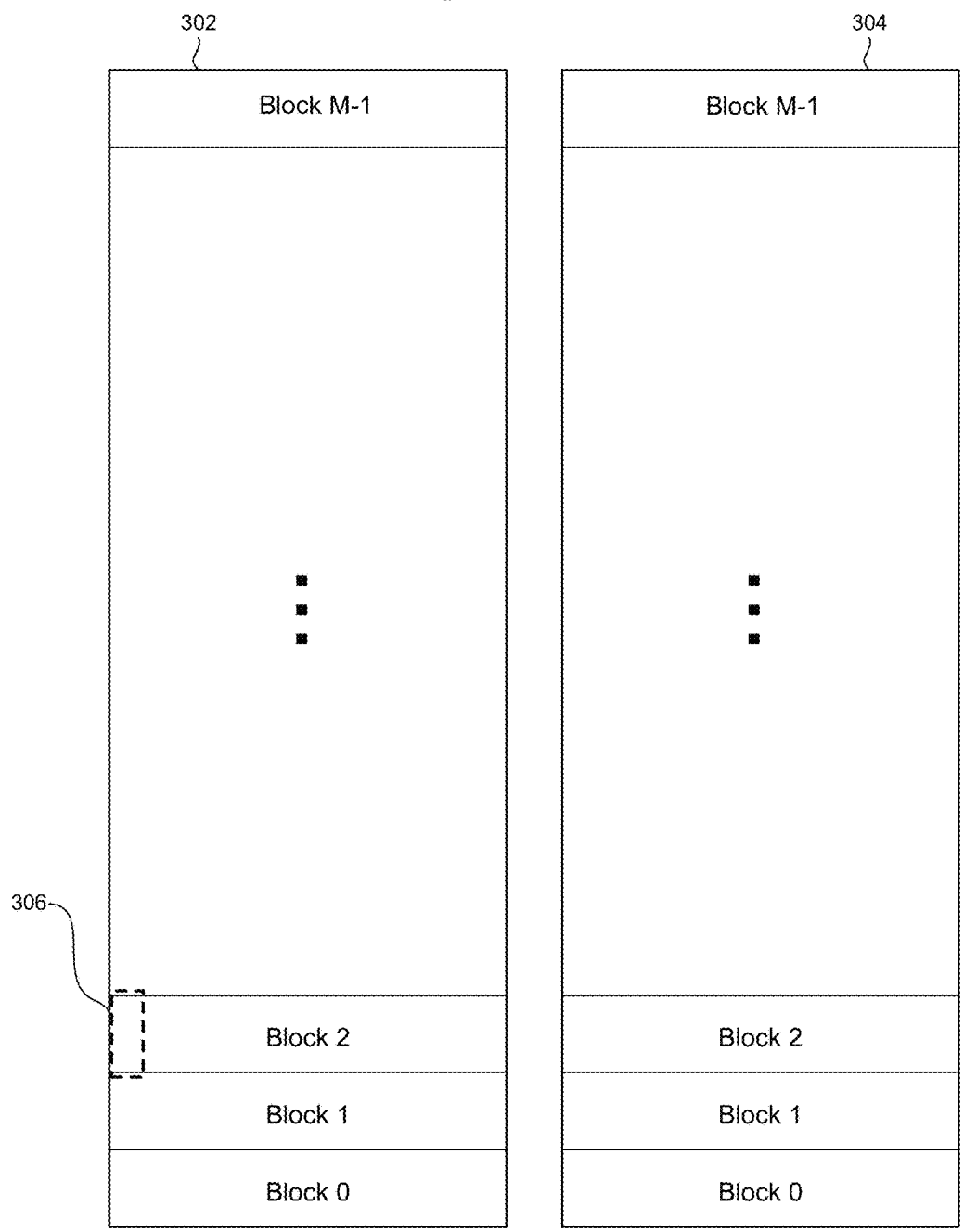

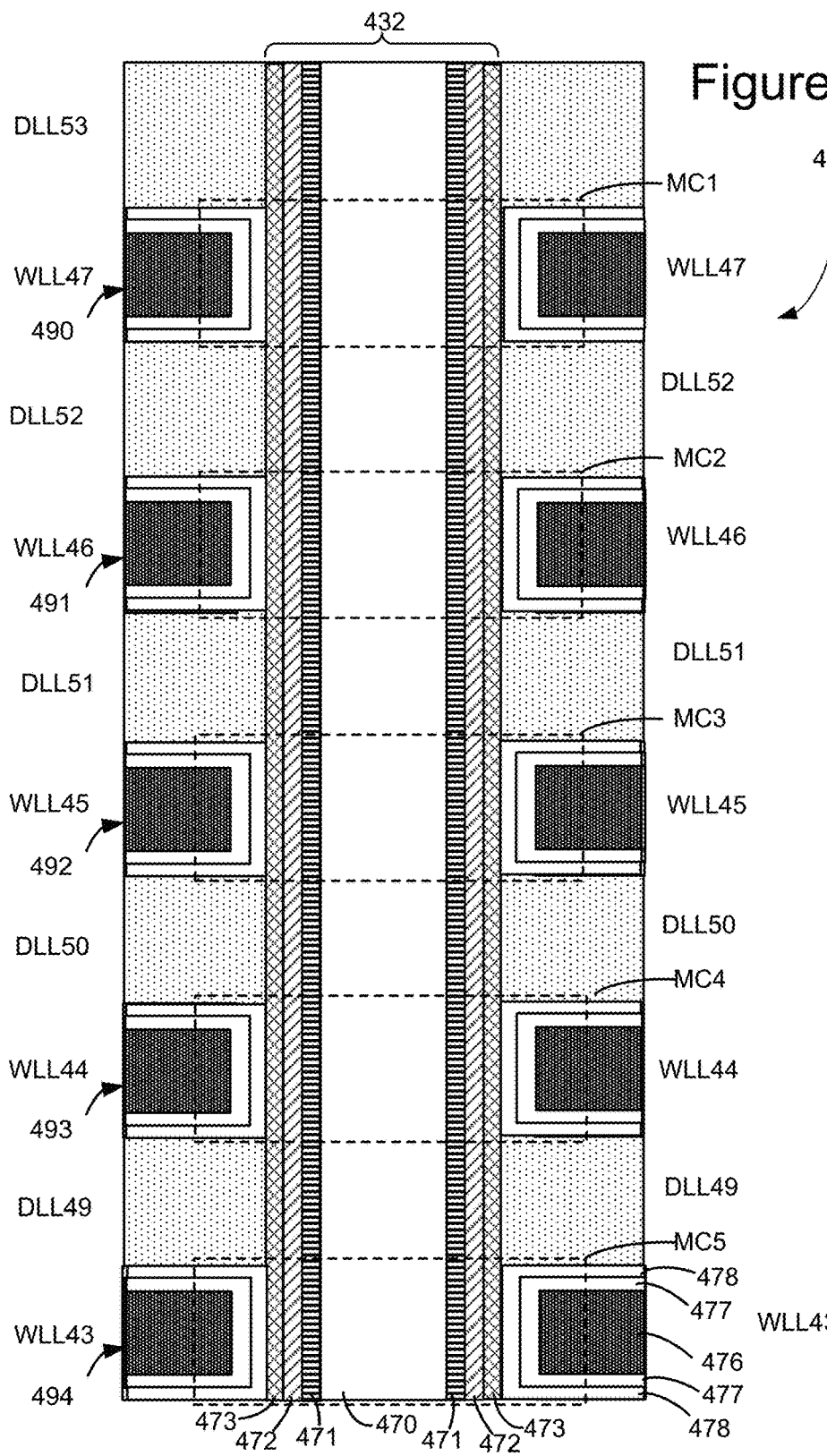

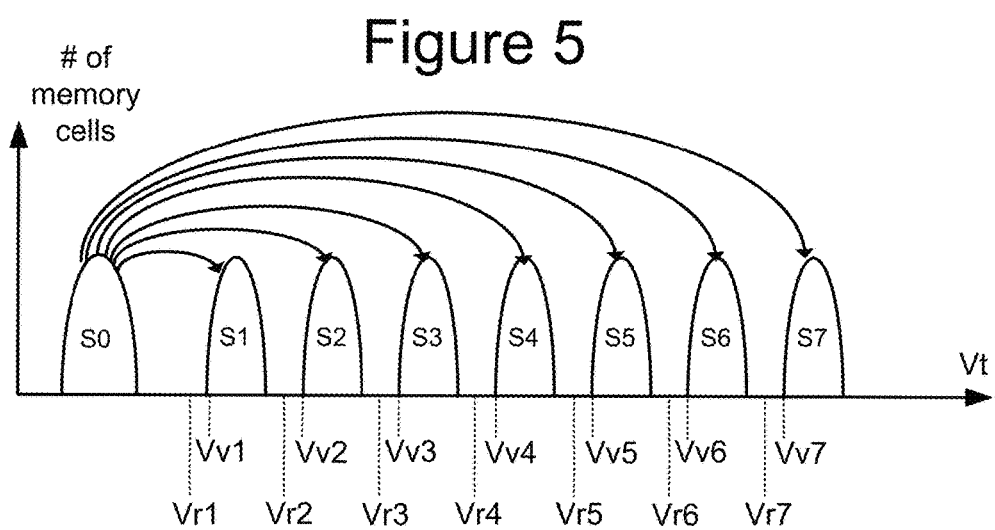

Figure 8A

| Expected retention | Code Rate |
|---|---|
| < 1 hour | A |
| < 1 day | B |
| <1 month | C |
| < 1 year | D |
| > 1 year | E |

Figure 8B

| Expected Temperature difference (Twrite-Tread) | Code Rate |
|---|---|
| < 30C | A |
| <40C | B |
| <50C | C |
| >50C | D |

Figure 8C

| Expected Read Freq. | Code Rate |
|---|---|
| Low | A |
| Med | B |
| High | C |

Figure 8D

| Backup access | Code Rate |
|---|---|
| Good | A |
| Medium | B |
| Poor | C |
| No backup | D |

NON-VOLATILE STORAGE WITH ADAPTIVE REDUNDANCY

BACKGROUND

Semiconductor memory is widely used in various electronic devices such as cellular telephones, digital cameras, personal digital assistants, medical electronics, mobile computing devices, and non-mobile computing devices. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

A charge-trapping material can be used in non-volatile memory devices to store a charge which represents a data state. The charge-trapping material can be arranged vertically in a three-dimensional (3D) stacked memory structure. One example of a 3D memory structure is the Bit Cost Scalable (BiCS) architecture which comprises a stack of alternating conductive and dielectric layers. A memory hole is formed in the stack and a vertical NAND string is then formed by filling the memory hole with materials including a charge-trapping layer to create a vertical column of memory cells. Each memory cell can store one or more bits of data.

When a memory system is deployed in an electronic device, the memory system may program data, read data and/or erase data. As with most electronic devices, performance is important to users. Errors may occur in data when the data is programmed, or after programming while the data is stored in the memory system. To allow such errors to be corrected, some redundant data may be calculated and stored with user data.

BRIEF DESCRIPTION OF THE DRAWINGS

Like-numbered elements refer to common components in the different figures.

FIG. 4A is a block diagram of a memory structure having two planes.

FIG. 4E is a cross sectional view of a vertical column of memory cells.

FIG. 5 depicts threshold voltage distributions.

FIGS. 8A-D illustrate examples of tables used to select code rates.

DETAILED DESCRIPTION

In a non-volatile memory system that calculates and stores redundant data with user data in a non-volatile memory array, a variable code rate encoder can adapt its code rate to the data it receives according to indicators provided by a host. While some data may be encoded with a nominal code rate, or default code rate, other data may be encoded with a higher or lower code rate according to one or more indicators sent by the host. Examples of indicators sent by a host include predictive indicators regarding the period of time the data is to be retained, including expected retention time, expected temperature range during retention with respect to a temperature when data was written, expected read frequency, or other indicators that may affect errors in data when it is read. An indicator from a host may also indicate ease of access to a backup copy, if any.

When data is encoded with different code rates, resulting in code words of different lengths, the code words may be written in pages that contain non-integer numbers of code words. For example, code words may wrap around from one page to the next. Thus, space saved by using short code words (e.g. shorter than a default code word length generated by a default code rate) is consolidated rather than being physically fragmented across many pages. Such saved space may be used for overprovisioning.

Figure 1:
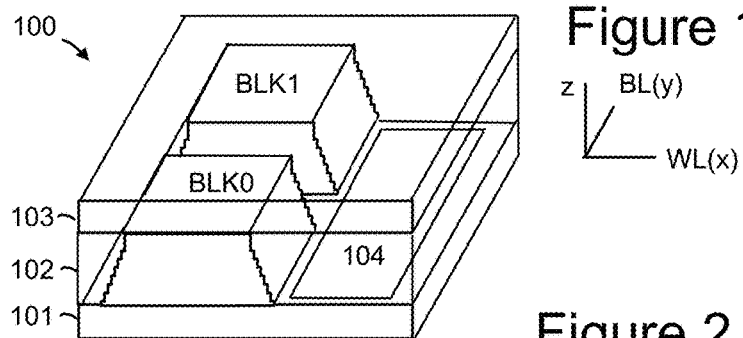
FIG. 1 is a perspective view of a 3D stacked non-volatile memory device.

FIGS. 1-4F describe one example of a memory system that can be used to implement the technology proposed herein. FIG. 1 is a perspective view of a three-dimensional (3D) stacked non-volatile memory device. The memory device 100 includes a substrate 101. On and above the substrate are example blocks BLK0 and BLK1 of memory cells (non-volatile storage elements). Also on substrate 101 is peripheral area 104 with support circuits for use by the blocks. Substrate 101 can also carry circuits under the blocks, along with one or more lower metal layers which are patterned in conductive paths to carry signals of the circuits. The blocks are formed in an intermediate region 102 of the memory device. In an upper region 103 of the memory device, one or more upper metal layers are patterned in conductive paths to carry signals of the circuits. Each block comprises a stacked area of memory cells, where alternating levels of the stack represent word lines. While two blocks are depicted as an example, additional blocks can be used, extending in the x- and/or y-directions.

In one example implementation, the length of the plane in the x-direction, represents a direction in which signal paths for word lines extend (a word line or SGD line direction), and the width of the plane in the y-direction, represents a direction in which signal paths for bit lines extend (a bit line direction). The z-direction represents a height of the memory device.

Figure 2:
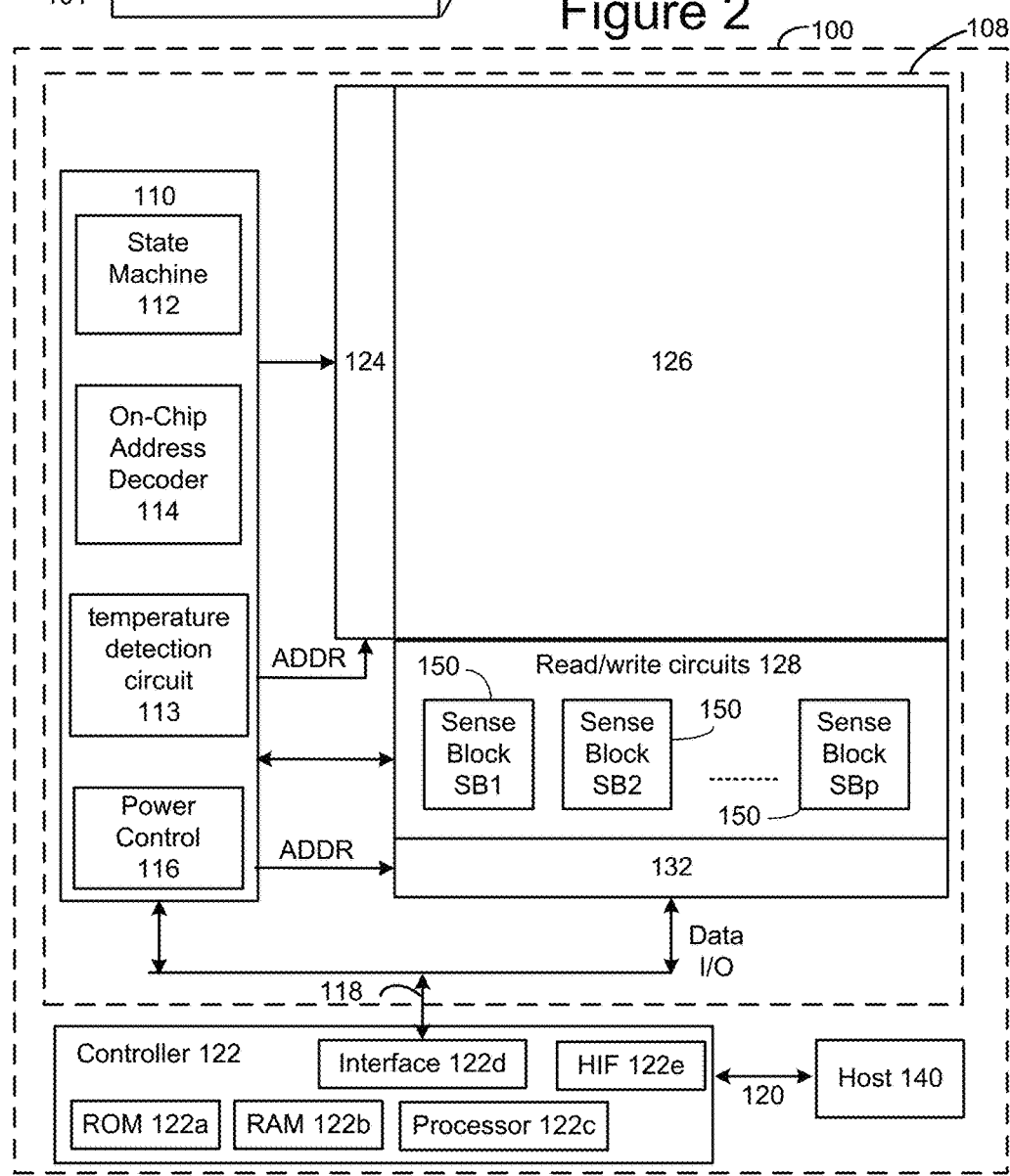
FIG. 2 is a functional block diagram of a memory device such as the 3D stacked non-volatile memory device 100 of FIG. 1.

FIG. 2 is a functional block diagram of an example memory device such as the 3D stacked non-volatile memory device 100 of FIG. 1. The components depicted in FIG. 2 are electrical circuits. Memory device 100 includes one or more memory die 108. Each memory die 108 includes a three-dimensional memory structure 126 of memory cells (such as, for example, a 3D array of memory cells), control circuitry 110, and read/write circuits 128. In other embodiments, a two-dimensional array of memory cells can be used. Memory structure 126 is addressable by word lines via a row decoder 124 and by bit lines via a column decoder 132. The read/write circuits 128 include multiple sense blocks 150 including SB1, SB2, ..., SBp (sensing circuitry) and allow a page of memory cells to be read or programmed in parallel. In some systems, a Controller 122 is included in the same memory device 100 (e.g., a removable storage card) as the one or more memory die 108. However, in other systems, the Controller can be separated from the memory die 108. In some embodiments, the Controller will be on a different die than the memory die. In some embodiments, one Controller 122 will communicate with multiple memory die 108. In other embodiments, each memory die 108 has its own Controller. Commands and data are transferred between the host 140 and Controller 122 via a data bus 120, and between Controller 122 and the one or more memory die 108 via lines 118. In one embodiment, memory die 108 includes a set of input and/or output (I/O) pins that connect to lines 118.

Memory structure 126 may comprise one or more arrays of memory cells including a 3D array. The memory structure may comprise a monolithic three-dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

Control circuitry 110 cooperates with the read/write circuits 128 to perform memory operations (e.g., erase, program, read, and others) on memory structure 126, and includes a state machine 112, an on-chip address decoder 114, and a power control module 116. The state machine 112 provides chip-level control of memory operations. Temperature detection circuit 113 is configured to detect temperature, and can be any suitable temperature detection circuit known in the art. In one embodiment, state machine 112 is programmable by the software. In other embodiments, state machine 112 does not use software and is completely implemented in hardware (e.g., electrical circuits). In one embodiment, control circuitry 110 includes registers, ROM fuses and other storage devices for storing default values such as base voltages and other parameters.

The on-chip address decoder 114 provides an address interface between addresses used by host 140 or Controller 122 to the hardware address used by the decoders 124 and 132. Power control module 116 controls the power and voltages supplied to the word lines and bit lines during memory operations. It can include drivers for word line layers (discussed below) in a 3D configuration, select transistors (e.g., SGS and SGD transistors, described below) and source lines. Power control module 116 may include charge pumps for creating voltages. The sense blocks include bit line drivers. An SGS transistor is a select gate transistor at a source end of a NAND string, and an SGD transistor is a select gate transistor at a drain end of a NAND string.

Any one or any combination of control circuitry 110, state machine 112, decoders 114/124/132, temperature detection circuit 113, power control module 116, sense blocks 150, read/write circuits 128, and Controller 122 can be considered one or more control circuits (or a managing circuit) that performs the functions described herein.

The (on-chip or off-chip) Controller 122 (which in one embodiment is an electrical circuit) may comprise one or more processors 122c, ROM 122a, RAM 122b, Memory Interface 122d and Host Interface 122e, all of which are interconnected. One or more processors 122C is one example of a control circuit. Other embodiments can use state machines or other custom circuits designed to perform one or more functions. The storage devices (ROM 122a, RAM 122b) comprises code such as a set of instructions, and the processor 122c is operable to execute the set of instructions to provide the functionality described herein. Alternatively, or additionally, processor 122c can access code from a storage device in the memory structure, such as a reserved area of memory cells connected to one or more word lines. Memory interface 122d, in communication with ROM 122a, RAM 122b and processor 122c, is an electrical circuit that provides an electrical interface between Controller 122 and memory die 108. For example, memory interface 122d can change the format or timing of signals, provide a buffer, isolate from surges, latch I/O, etc. Processor 122C can issue commands to control circuitry 110 (or any other component of memory die 108) via Memory Interface 122d. Host Interface 122e in communication with ROM 122a, RAM 122b and processor 122c, is an electrical circuit that provides an electrical interface between Controller 122 and host 140. For example, Host Interface 122e can change the format or timing of signals, provide a buffer, isolate from surges, latch I/O, etc. Commands and data from host 140 are received by Controller 122 via Host Interface 122e. Data sent to host 140 are transmitted via Host Interface 122e.

Multiple memory elements in memory structure 126 may be configured so that they are connected in series or so that each element is individually accessible. By way of non-limiting example, flash memory devices in a NAND configuration (NAND flash memory) typically contain memory elements connected in series. A NAND string is an example of a set of series-connected memory cells and select gate transistors.

A NAND flash memory array may be configured so that the array is composed of multiple NAND strings of which a NAND string is composed of multiple memory cells sharing a single bit line and accessed as a group. Alternatively, memory elements may be configured so that each element is individually accessible, e.g., a NOR memory array. NAND and NOR memory configurations are exemplary, and memory cells may be otherwise configured.

The memory cells may be arranged in the single memory device level in an ordered array, such as in a plurality of rows and/or columns. However, the memory elements may be arrayed in non-regular or non-orthogonal configurations, or in structures not considered arrays.

A three-dimensional memory array is arranged so that memory cells occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three-dimensional memory structure may be vertically arranged as a stack of multiple two-dimensional memory device levels. As another non-limiting example, a three-dimensional memory array may be arranged as multiple vertical columns (e.g., columns extending substantially perpendicular to the major surface of the substrate, i.e., in they direction) with each column having multiple memory cells. The vertical columns may be arranged in a two-dimensional configuration, e.g., in an x-y plane, resulting in a three-dimensional arrangement of memory cells, with memory cells on multiple vertically stacked memory planes. Other configurations of memory elements in three dimensions can also constitute a three-dimensional memory array.

By way of non-limiting example, in a three-dimensional NAND memory array, the memory elements may be coupled together to form vertical NAND strings that traverse across multiple horizontal memory device levels. Other three-dimensional configurations can be envisioned wherein some NAND strings contain memory elements in a single memory level while other strings contain memory elements which span through multiple memory levels. Three-dimensional memory arrays may also be designed in a NOR configuration and in a ReRAM configuration.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
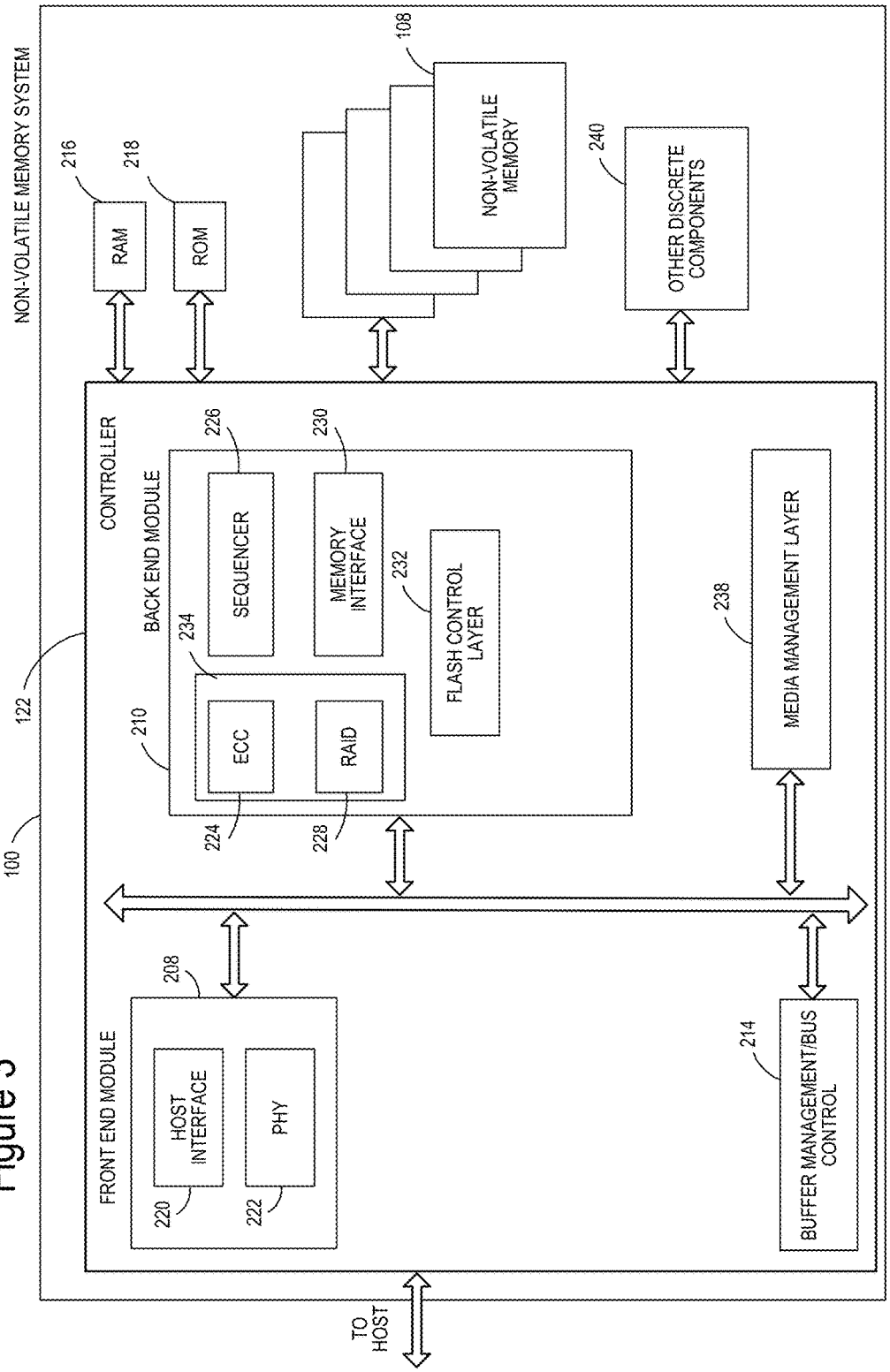
FIG. 3 is a block diagram depicting one embodiment of a Controller.

FIG. 3 is a block diagram of example memory system 100, depicting more details of Controller 122. In one embodiment, the system of FIG. 3 is a solid-state drive (SSD). As used herein, a flash memory Controller is a device that manages data stored on flash memory and communicates with a host, such as a computer or electronic device. A flash memory Controller can have various functionality in addition to the specific functionality described herein. For example, the flash memory Controller can format the flash memory to ensure the memory is operating properly, map out bad flash memory cells, and allocate spare memory cells to be substituted for future failed cells. Some part of the spare cells can be used to hold firmware to operate the flash memory Controller and implement other features. In operation, when a host needs to read data from or write data to the flash memory, it will communicate with the flash memory Controller. If the host provides a logical address to which data is to be read/written, the flash memory Controller can convert the logical address received from the host to a physical address in the flash memory. (Alternatively, the host can provide the physical address). The flash memory Controller can also perform various memory management functions, such as, but not limited to, wear leveling (distributing writes to avoid wearing out specific blocks of memory that would otherwise be repeatedly written to) and garbage collection (after a block is full, moving only the valid pages of data to a new block, so the full block can be erased and reused).

The communication interface between Controller 122 and non-volatile memory die 108 may be any suitable flash interface, such as Toggle Mode 200, 400, or 800. In one embodiment, memory system 100 may be a card based system, such as a secure digital (SD) or a micro secure digital (micro-SD) card. In an alternate embodiment, memory system 100 may be part of an embedded memory system. For example, the flash memory may be embedded within the host, such as in the form of a solid-state disk (SSD) drive installed in a personal computer.

In some embodiments, non-volatile memory system 100 includes a single channel between Controller 122 and non-volatile memory die 108, the subject matter described herein is not limited to having a single memory channel. For example, in some memory system architectures, 2, 4, 8 or more channels may exist between the Controller and the memory die, depending on Controller capabilities. In any of the embodiments described herein, more than a single channel may exist between the Controller and the memory die, even if a single channel is shown in the drawings.

As depicted in FIG. 3, Controller 122 includes a front-end module 208 that interfaces with a host, a back-end module 210 that interfaces with the one or more non-volatile memory die 108, and various other modules that perform functions which will now be described in detail.

The components of Controller 122 depicted in FIG. 3 may take the form of a packaged functional hardware unit (e.g., an electrical circuit) designed for use with other components, a portion of a program code (e.g., software or firmware) executable by a (micro)processor or processing circuitry (or one or more processors) that usually performs a particular function of related functions, or a self-contained hardware or software component that interfaces with a larger system, for example. For example, each module may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively, or in addition, each module may include or comprise software stored in a processor readable device (e.g., memory) to program one or more processors for Controller 122 to perform the functions described herein. The architecture depicted in FIG. 3 is one example implementation that may (or may not) use the components of Controller 122 depicted in FIG. 2 (i.e. RAM, ROM, processor, interface).

Referring again to modules of the Controller 122, a buffer manager/bus Controller 214 manages buffers in random access memory (RAM) 216 and controls the internal bus arbitration of Controller 122. A read only memory (ROM) 218 stores system boot code. Although illustrated in FIG. 3 as located separately from the Controller 122, in other embodiments one or both of the RAM 216 and ROM 218 may be located within the Controller. In yet other embodiments, portions of RAM and ROM may be located both within the Controller 122 and outside the Controller. Further, in some implementations, the Controller 122, RAM 216, and ROM 218 may be located on separate semiconductor die.

Front end module 208 includes a host interface 220 and a physical layer interface 222 (PHY) that provide the electrical interface with the host or next level storage Controller. The choice of the type of host interface 220 can depend on the type of memory being used. Examples of host interfaces 220 include, but are not limited to, SATA, SATA Express, SAS, Fibre Channel, USB, PCIe, and NVMe. The host interface 220 may be a communication interface that facilitates transfer for data, control signals, and timing signals.

Back end module 210 includes an error correction Controller (ECC) engine, ECC engine 224, that encodes the data bytes received from the host, and decodes and error corrects the data bytes read from the non-volatile memory. A command sequencer 226 generates command sequences, such as program and erase command sequences, to be transmitted to non-volatile memory die 108. A RAID (Redundant Array of Independent Dies) module 228 manages generation of RAID parity and recovery of failed data. The RAID parity may be used as an additional level of integrity protection for the data being written into the non-volatile memory system 100. In some cases, the RAID module 228 may be a part of the ECC engine 224. Note that the RAID parity may be added as an extra die or dies as implied by the common name, but it may also be added within the existing die, e.g. as an extra plane, or extra block, or extra WLs within a block. ECC engine 224 and RAID module 228 both calculate redundant data that can be used to recover when errors occur and may be considered examples of redundancy encoders. Together, ECC engine 224 and RAID module 228 may be considered to form a combined redundancy encoder 234. A memory interface 230 provides the command sequences to non-volatile memory die 108 and receives status information from non-volatile memory die 108. In one embodiment, memory interface 230 may be a double data rate (DDR) interface, such as a Toggle Mode 200, 400, or 800 interface. A flash control layer 232 controls the overall operation of back end module 210.

Additional components of memory system 100 illustrated in FIG. 3 include media management layer 238, which performs wear leveling of memory cells of non-volatile memory die 108. Memory system 100 also includes other discrete components 240, such as external electrical interfaces, external RAM, resistors, capacitors, or other components that may interface with Controller 122. In alternative embodiments, one or more of the physical layer interface 222, RAID module 228, media management layer 238 and buffer management/bus Controller 214 are optional components that are not necessary in the Controller 122.

The Flash Translation Layer (FTL) or Media Management Layer (MML) 238 may be integrated as part of the flash management that may handle flash errors and interfacing with the host. In particular, MML may be a module in flash management and may be responsible for the internals of NAND management. In particular, the MML 238 may include an algorithm in the memory device firmware which translates writes from the host into writes to the flash memory 126 of memory die 108. The MML 238 may be needed because: 1) the flash memory may have limited endurance; 2) the flash memory 126 may only be written in multiples of pages; and/or 3) the flash memory 126 may not be written unless it is erased as a block. The MML 238 understands these potential limitations of the flash memory 126 which may not be visible to the host. Accordingly, the MML 238 attempts to translate the writes from host into writes into the flash memory 126.

Controller 122 may interface with one or more memory dies 108. In in one embodiment, Controller 122 and multiple memory dies (together comprising non-volatile storage system 100) implement a solid-state drive (SSD), which can emulate, replace or be used instead of a hard disk drive inside a host, as a NAS device, etc. Additionally, the SSD need not be made to work as a hard drive.

Figure 4:
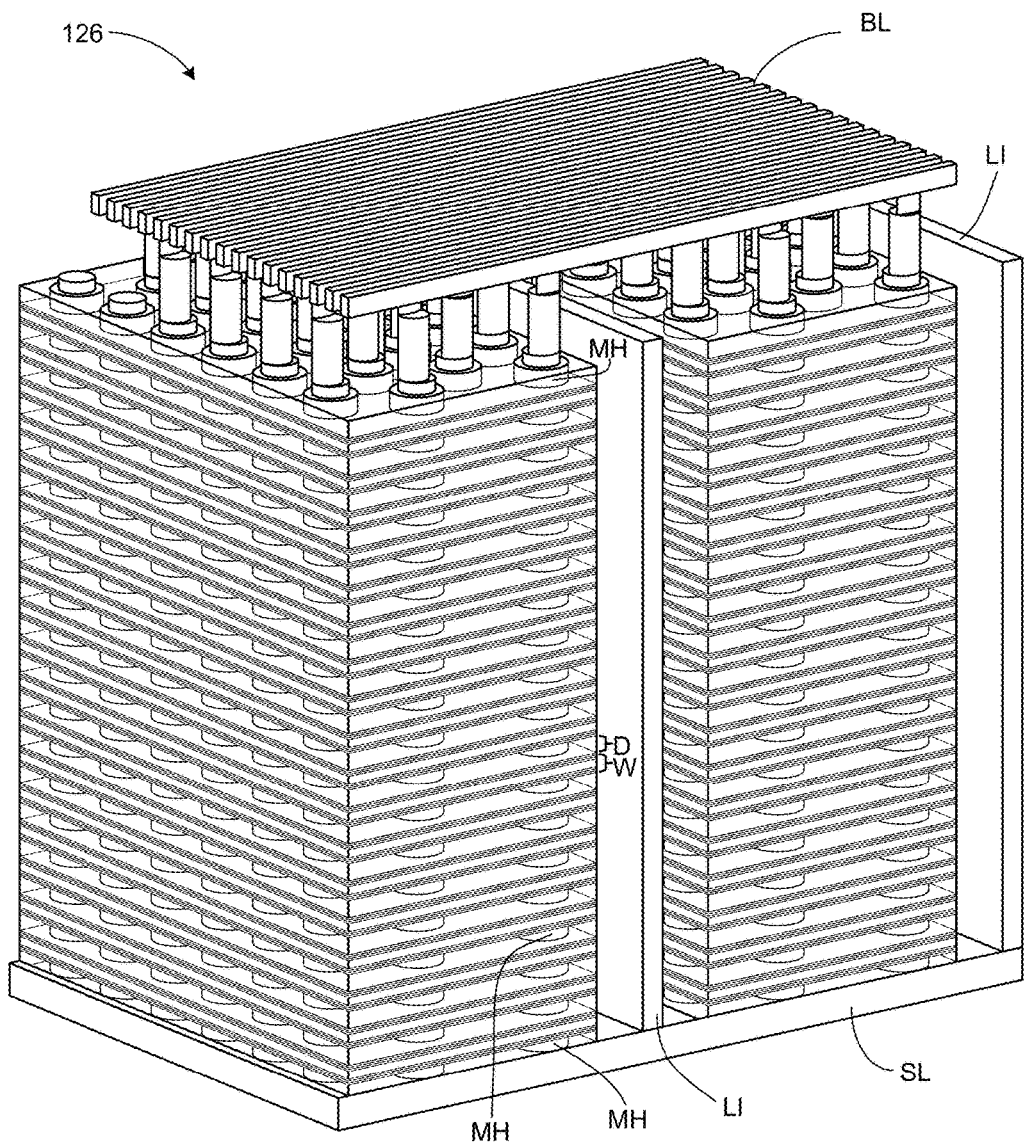
FIG. 4 is a perspective view of a portion of one embodiment of a three-dimensional monolithic memory structure.

FIG. 4 is a perspective view of a portion of a monolithic three-dimensional memory structure 126, which includes a plurality memory cells. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-216 alternating dielectric layers and conductive layers, for example, 96 data word line layers, 8 select layers, 4 dummy word line layers and 108 dielectric layers. More or less than 108-216 layers can also be used. As will be explained below, the alternating dielectric layers and conductive layers are divided into four "fingers" by local interconnects LI. FIG. 4 only shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three-dimensional monolithic memory structure 126 is provided below with respect to FIG. 4A-4F.

FIG. 4A is a block diagram explaining one example organization of memory structure 126, which is divided into two planes 302 and 304. Each plane is then divided into M blocks. In one example, each plane has about 2000 blocks. However, different numbers of blocks and planes can also be used. In one embodiment, for two plane memory, the block IDs are usually such that even blocks belong to one plane and odd blocks belong to another plane; therefore, plane 302 includes block 0, 2, 4, 6, . . . and plane 304 includes blocks 1, 3, 5, 7, . . . In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits.

Figure 4B:
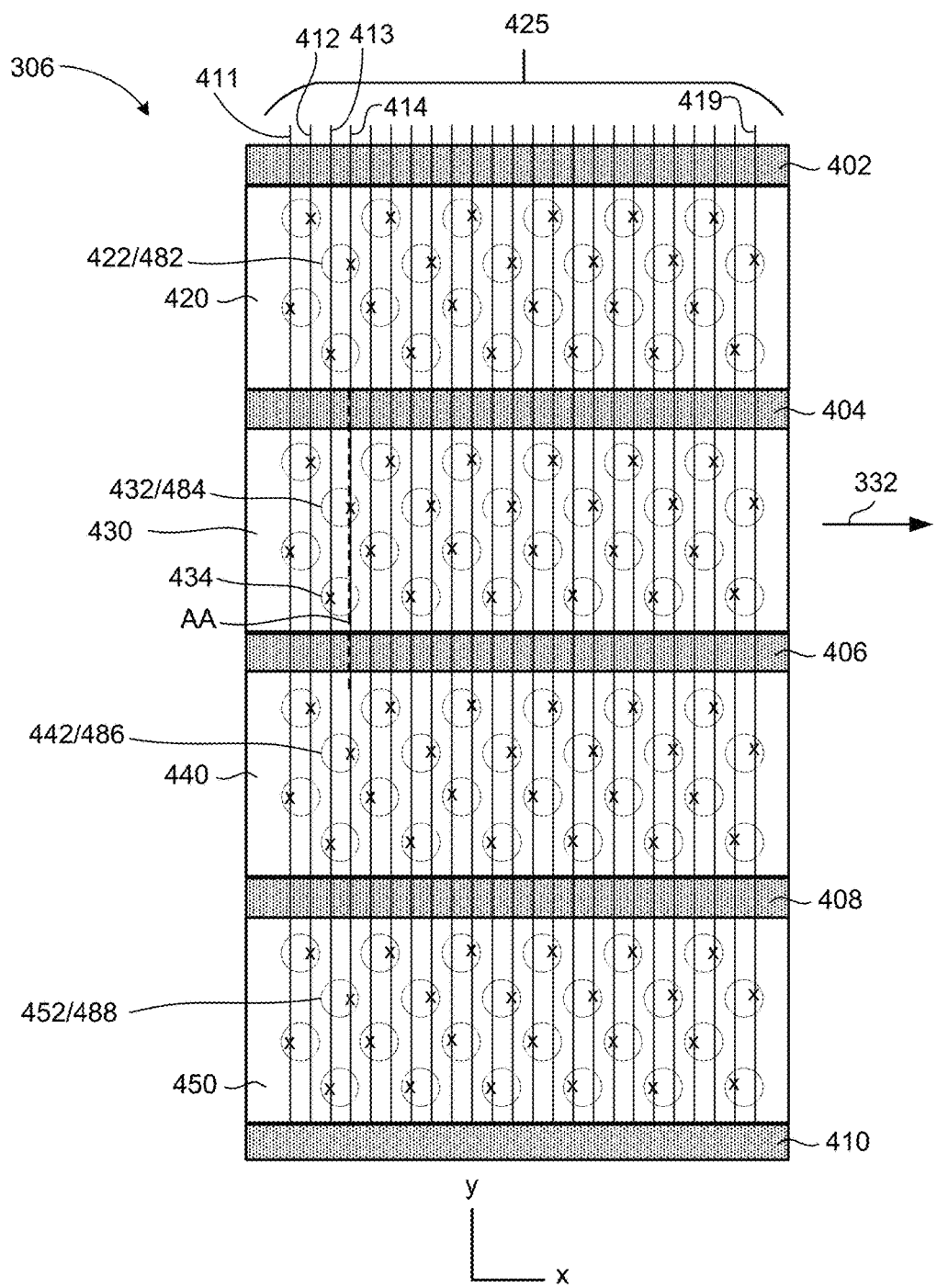
FIG. 4B depicts a top view of a portion of a block of memory cells.

FIGS. 4B-4F depict an example 3D NAND structure. FIG. 4B is a block diagram depicting a top view of a portion of one block from memory structure 126. The portion of the block depicted in FIG. 4B corresponds to portion 306 in block 2 of FIG. 4A. As can be seen from FIG. 4B, the block depicted in FIG. 4B extends in the direction of 332. In one embodiment, the memory array will have 60 layers. Other embodiments have less than or more than 60 layers. However, FIG. 4B only shows the top layer.

FIG. 4B depicts a plurality of circles that represent the vertical columns. Each of the vertical columns include multiple select transistors and multiple memory cells. In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 330 and in the direction of arrow 332, the block includes more vertical columns than depicted in FIG. 4B

FIG. 4B also depicts a set of bit lines 425, including bit lines 411, 412, 413, 414, . . . 419. FIG. 4B shows twenty-four bit lines because only a portion of the block is depicted. It is contemplated that more than twenty-four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side select lines and the drain side select lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
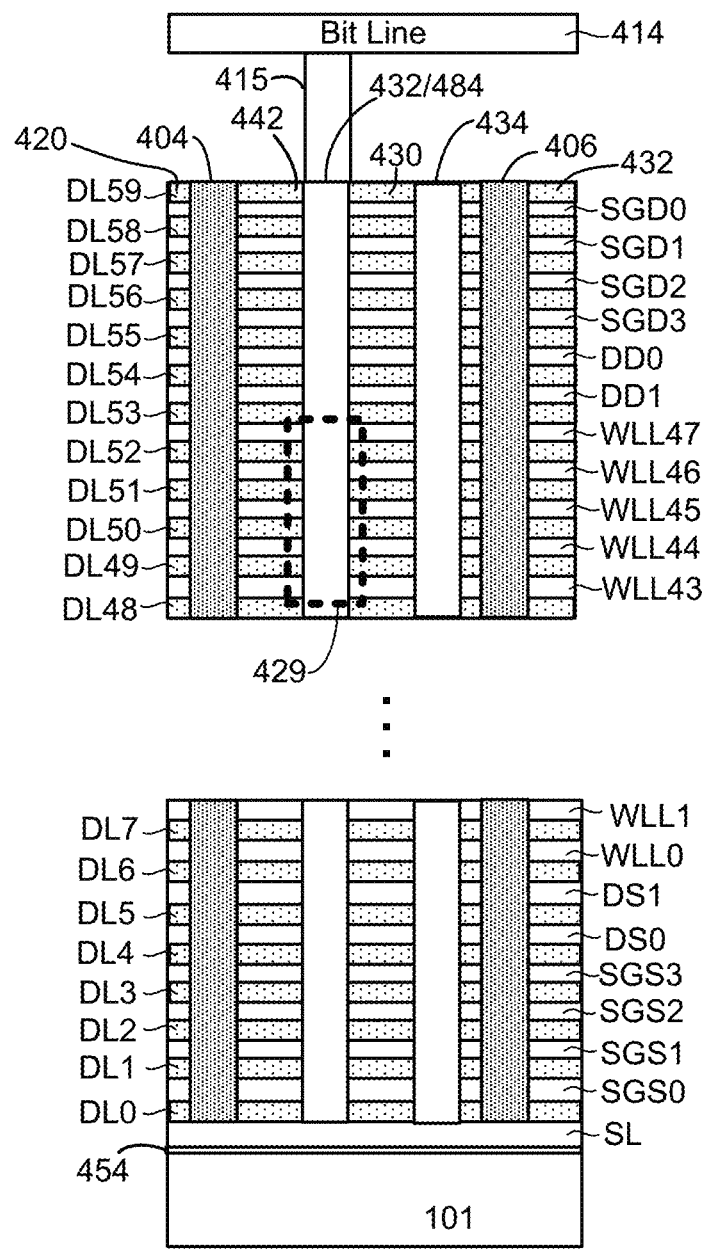
FIG. 4C depicts a cross sectional view of a portion of a block of memory cells.

FIG. 4C depicts a portion of an embodiment of three-dimensional memory structure 126 showing a cross-sectional view along line AA of FIG. 4B. This cross-sectional view cuts through vertical columns 432 and 434 and region 430 (see FIG. 4B). The structure of FIG. 4C includes four drain side select layers SGD0, SGD1, SGD2 and SGD3; four source side select layers SGS0, SGS1, SGS2 and SGS3; four dummy word line layers DD0, DD1, DS0 and DS1; and forty-eight data word line layers WLL0-WLL47 for connecting to data memory cells. Other embodiments can implement more or less than four drain side select layers, more or less than four source side select layers, more or less than four dummy word line layers, and more or less than forty-eight-word line layers (e.g., 96 word line layers). Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL47 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL59. For example, dielectric layers DL49 is above word line layer WLL43 and below word line layer WLL44. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layer WLL0-WLL47 connect to memory cells (also called data memory cells). Dummy word line layers DD0, DD1, DS0 and DS1 connect to dummy memory cells. A dummy memory cell does not store user data, while a data memory cell is eligible to store user data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

Figure 4D:
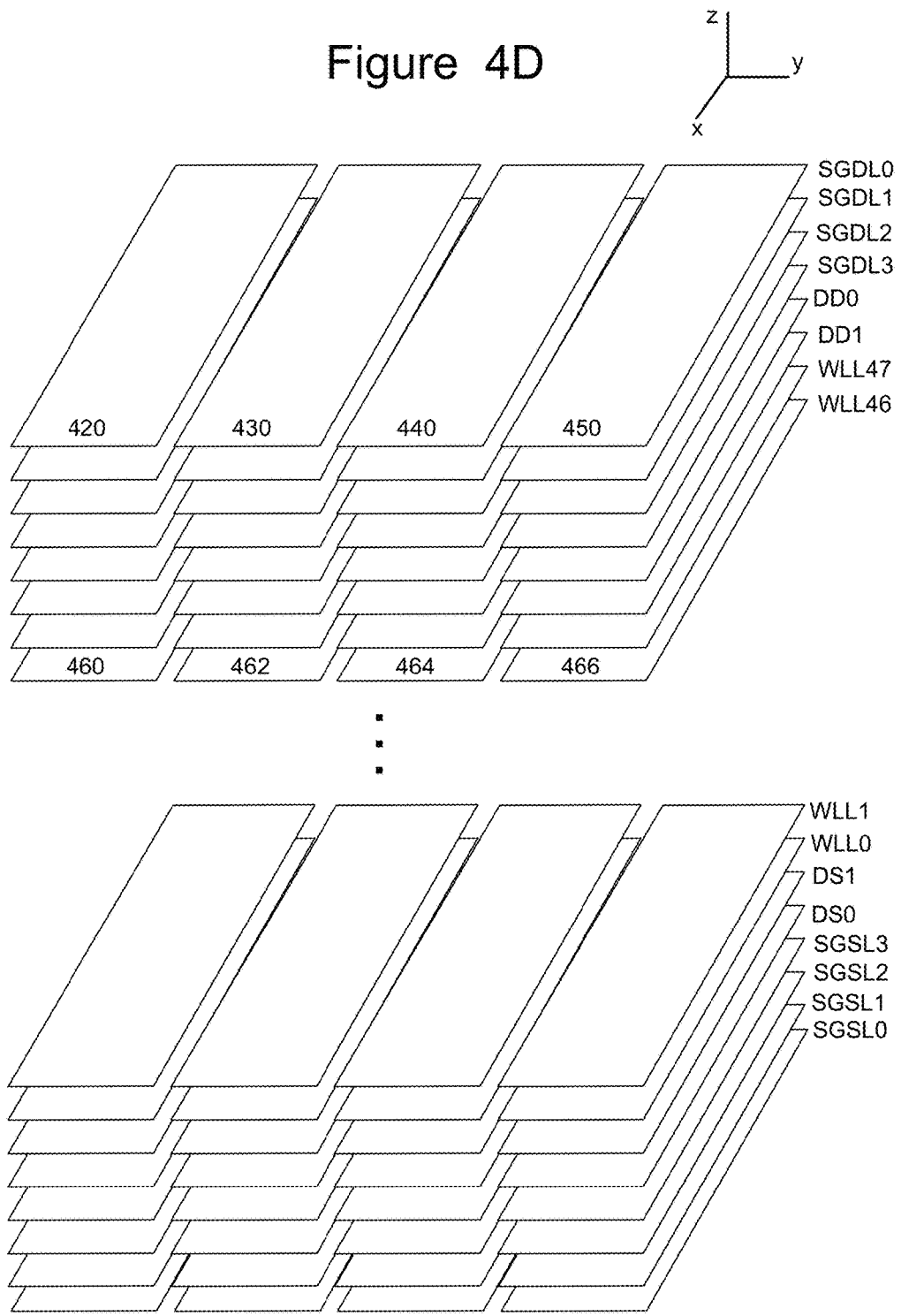
FIG. 4D depicts a view of the select gate layers and word line layers.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL47) for the block that is partially depicted in FIG. 4C. As mentioned above with respect to FIG. 4B, in one embodiment, local interconnects 402, 404, 406, 408 and 410 break up each conductive layer into four regions or fingers. For example, word line layer WLL31 is divided into regions 460, 462, 464 and 466. For word line layers (WLL0-WLL31), the regions are referred to as word line fingers; for example, word line layer WLL46 is divided into word line fingers 460, 462, 464 and 466. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

FIG. 4E depicts a cross sectional view of region 429 of FIG. 4C that includes a portion of vertical column 432. In one embodiment, the vertical columns are round and include four layers; however, in other embodiments more or less than four layers can be included and other shapes can be used. In one embodiment, vertical column 432 includes an inner core 470 that is made of a dielectric, such as $SiO_2$. Other materials can also be used. Surrounding inner core 470 is a polysilicon channel, channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide layer 478 ($SiO_2$). The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming a non-volatile storage system is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
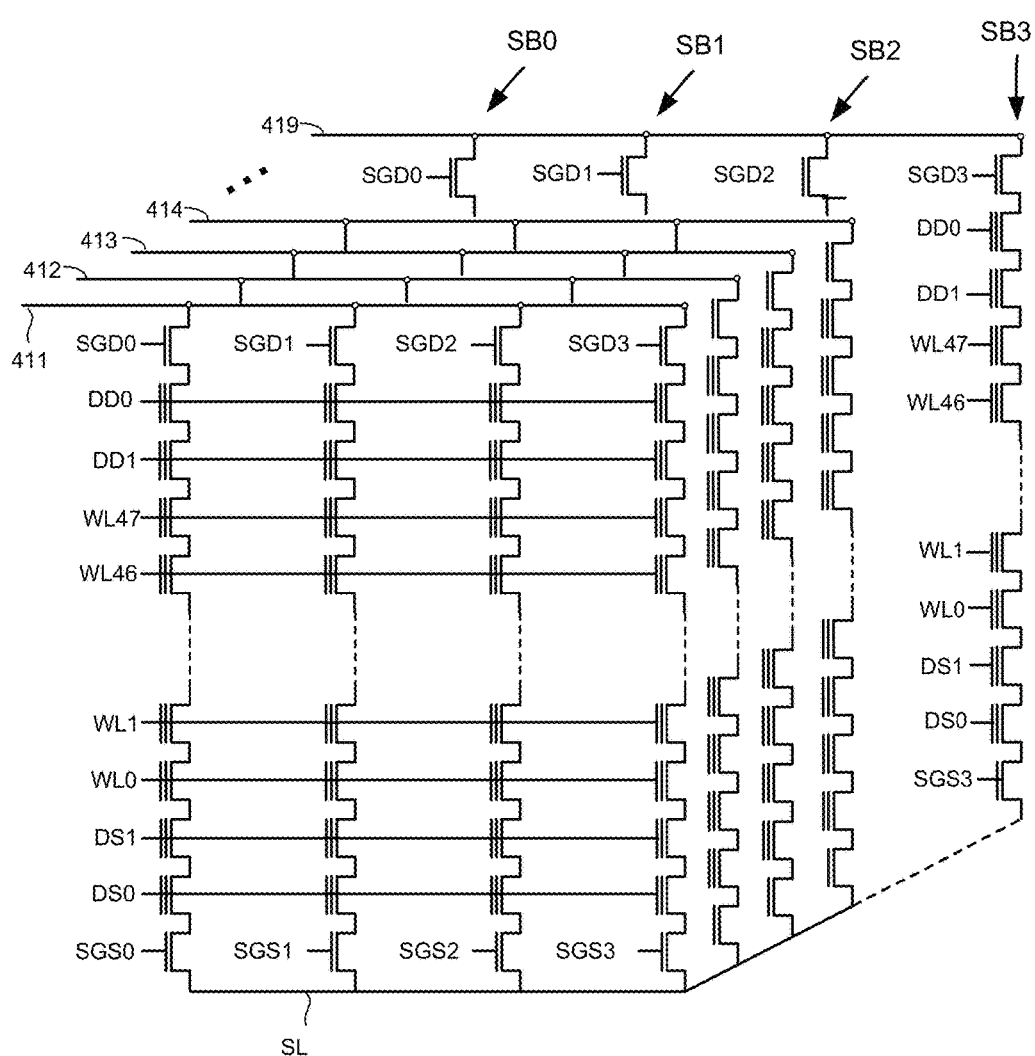
FIG. 4F is a schematic of a plurality of NAND strings.

FIG. 4F shows physical word lines WLL0-WLL47 running across the entire block. The structure of FIG. 4G corresponds to portion 306 in Block 2 of FIGS. 4A-F, including bit lines 411, 412, 413, 414, . . . 419. Within the block, each bit line connected to four NAND strings. Drain side select lines SGD0, SGD1, SGD2 and SGD3 are used to determine which of the four NAND strings connect to the associated bit line. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 4-4F is a three-dimensional memory structure that includes vertical NAND strings with charge-trapping material, other (2D and 3D) memory structures can also be used with the technology described herein. For example, floating gate memories (e.g., NAND-type and NOR-type flash memory ReRAM memories, magnetoresistive memory (e.g., MRAM), and phase change memory (e.g., PCRAM) can also be used.

One example of a ReRAM memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. This configuration is known as a spin valve and is the simplest structure for an MRAM bit. A memory device is built from a grid of such memory cells. In one embodiment for programming a non-volatile storage system, each memory cell lies between a pair of write lines arranged at right angles to each other, parallel to the cell, one above and one below the cell. When current is passed through them, an induced magnetic field is created.

Phase change memory (PCRAM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory cell array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 also shows seven read reference voltages, Vr1, Vr2, Vr3, Vr4, Vr5, Vr6, andVr7, for reading data from memory cells. By testing whether the threshold voltage of a given memory cell is above or below the seven read reference voltages, the system can determine what data state (i.e., S0, S1, S2, S3, . . . ) the memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv4. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-D7 can overlap, with Controller 122 relying on ECC to identify the correct data being stored.

Redundancy Code Rate

Because it is possible that errors can occur when programming or reading, and errors can occur while storing data (e.g., due to electrons drifting, data retention issues or other phenomenon), error correction is used with the programming of data. Memory systems often use Error Correction Codes (ECC) to protect data from corruption. Many ECC coding schemes are well known in the art. These error correction codes are especially useful in large scale memories, including flash (and other non-volatile) memories, because of the substantial impact on manufacturing yield and device reliability that such coding schemes can provide, rendering devices that have a few non-programmable or defective cells as useable. Of course, a tradeoff exists between the yield savings and the cost of providing additional memory cells to store the code bits (i.e., the code "rate"). As such, some ECC codes are better suited for flash memory devices than others. Generally, ECC codes for flash memory devices tend to have higher code rates (i.e., a lower ratio of code bits to data bits) than the codes used in data communications applications (which may have code rates as low as 1/2). Examples of well-known ECC codes commonly used in connection with flash memory storage include Reed-Solomon codes, other BCH codes, Hamming codes, and the like. Sometimes, the error correction codes used in connection with flash memory storage are "systematic," in that the data portion of the eventual code word is unchanged from the actual data being encoded, with the code or parity bits appended to the data bits to form the complete code word. In other cases, the data being encoded is transformed during encoding.

The particular parameters for a given error correction code include the type of code, the size of the block of actual data from which the code word is derived, and the overall length of the code word after encoding. For example, a typical BCH code applied to a sector of 512 bytes (4096 bits) of data can correct up to four error bits, if at least 60 ECC or parity bits are used. Reed-Solomon codes are a subset of BCH codes, and are also commonly used for error correction. For example, a typical Reed-Solomon code can correct up to four errors in a 512-byte sector of data, using about 72 ECC bits. In the flash memory context, error correction coding provides substantial improvement in manufacturing yield, as well as in the reliability of the flash memory over time.

In some embodiments, the Controller 122 receives host data, also referred to as information bits, that is to be stored non-volatile three-dimensional memory structure 126. The informational bits are represented by the matrix i=[1 0] (note that two bits are used for example purposes only, and many embodiments have code words longer than two bits). An error correction coding process (such as any of the processes mentioned above or below) is implemented in which parity bits are added to the informational bits to provide data represented by the matrix or code word v=[1 0 1 0], indicating that two parity bits have been appended to the data bits. Other techniques can be used that map input data to output data in more complex manners. For example, low density parity check (LDPC) codes, also referred to as Gallager codes, can be used. More details about LDPC codes can be found in R. G. Gallager, "Low-density parity-check codes," IRE Trans. Inform. Theory, vol. IT-8, pp. 21 28, January 1962; and D. MacKay, Information Theory, Inference and Learning Algorithms, Cambridge University Press 2003, chapter 47. In practice, such LDPC codes may be applied to multiple pages encoded across a number of storage elements, but they do not need to be applied across multiple pages. The data bits can be mapped to a logical page and stored in the non-volatile structure 126 by programming one or more memory cells to one or more programming states, which corresponds to v.

In one possible implementation, an iterative probabilistic decoding process is used when reading data which implements error correction decoding corresponding to the encoding implemented in the Controller 122 (see ECC engine 224). Further details regarding iterative probabilistic decoding can be found in the above-mentioned D. MacKay text. The iterative probabilistic decoding attempts to decode a code word read from the memory by assigning initial probability metrics to each bit in the code word. The probability metrics indicate a reliability of each bit, that is, how likely it is that the bit is not in error. In one approach, the probability metrics are logarithmic likelihood ratios LLRs which are obtained from LLR tables. LLR values are measures of the reliability with which the values of various binary bits read from the storage elements are known.

The LLR for a bit is given by $$Q = \log_2 \frac{P(v=0|Y)}{P(v=1|Y)},$$

where P(v=0|Y) is the probability that a bit is a 0 given the condition that the state read is Y, and P(v=1|Y) is the probability that a bit is a 1 given the condition that the state read is Y. Thus, an LLR>0 indicates a bit is more likely a 0 than a 1, while an LLR<0 indicates a bit is more likely a 1 than a 0, to meet one or more parity checks of the error correction code. Further, a greater magnitude indicates a greater probability or reliability. Thus, a bit with an LLR=63 is more likely to be a 0 than a bit with an LLR=5, and a bit with an LLR=−63 is more likely to be a 1 than a bit with an LLR=−5. LLR=0 indicates the bit is equally likely to be a 0 or a 1.

An LLR value can be provided for each of the bit positions in a code word. Further, the LLR tables can account for the multiple read results so that an LLR of greater magnitude is used when the bit value is consistent in the different code words.

Controller 122 receives the code word Y1 and accesses the LLRs and iterates in successive iterations in which it determines if parity checks of the error encoding process have been satisfied. If all parity checks have been satisfied, the decoding process has converged and the code word has been successfully error corrected. If one or more parity checks have not been satisfied, the decoder will adjust the LLRs of one or more of the bits which are inconsistent with a parity check and then reapply the parity check or next check in the process to determine if it has been satisfied. For example, the magnitude and/or polarity of the LLRs can be adjusted. If the parity check in question is still not satisfied, the LLR can be adjusted again in another iteration. Adjusting the LLRs can result in flipping a bit (e.g., from 0 to 1 or from 1 to 0) in some, but not all, cases. In one embodiment, another parity check is applied to the code word, if applicable, once the parity check in question has been satisfied. In others, the process moves to the next parity check, looping back to the failed check at a later time. The process continues in an attempt to satisfy all parity checks. Thus, the decoding process of Y1 is completed to obtain the decoded information including parity bits v and the decoded information bits i.

Redundancy may be provided by using a RAID type arrangement as an additional level of integrity protection for the data being written into a non-volatile memory system. In some cases, the RAID module may be a part of an ECC engine, or may be combined with an ECC engine, or ECC engines, to form a combined redundancy encoder, that encodes received data to provide encoded data with a combined code rate (i.e. the overall code rate may be based on the redundant bits added by ECC and RAID). Note that the RAID parity may be added as an extra die or dies, within a single die, e.g. as an extra plane, or extra block, or extra WLs within a block or in some other way.

Variable Code Rates

In general, redundancy encoding of data at a lower code rate (with more redundant bits) provides greater protection at the cost of additional space required to store the redundant bits. Encoding at a higher code rate (with fewer redundant bits) saves space at the cost of reduced protection. In some examples, a redundancy encoder has a variable code rate so that different code rates can be applied to different data prior to storage. Such a variable code rate may be achieved in a variety of ways. For example, a redundancy encoder may be configurable so that it can add more or fewer redundant bits. For example, an ECC encoder may be configured with two or more configurations that can encode a portion of user data with two or more different code rates. Similarly, a RAID controller may be configured to apply different RAID schemes with different levels of redundancy to different data. A redundancy encoder with variable code rate may include ECC and/or RAID and/or other encoding elements that have a combined code rate that can be changed (i.e. at least two code rates can be provided).

Figure 6A:
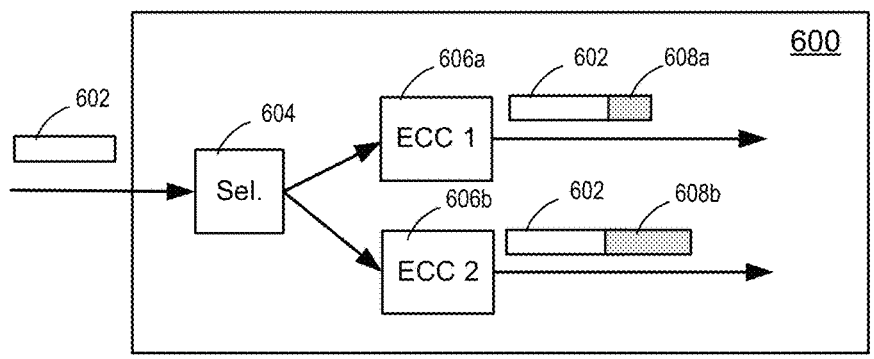
FIGS. 6A-C show examples of redundancy encoders with variable code rates.

FIG. 6A shows an example of a variable code rate encoder 600 that may be used in a memory system such as a memory described previously or below, to encode data prior to storage in memory. A portion of data 602 (e.g. a sector or other unit) is received by variable code rate encoder 600 and a code rate selector 604 sends it to either a first ECC encoder 606a or a second ECC encoder 606b. First ECC encoder 606a encodes a portion of data with a first code rate while second ECC encoder 606b encodes a portion of data with a second code rate that is lower than the first code rate (i.e. provides more redundant bits for a given amount of user data). Both encoding options are illustrated in FIG. 6A, though either the first ECC encoder 606a or second ECC encoder 606b (not both) will generally encode a given portion of data. The different code rates of first ECC encoder 606a and second ECC encoder 606b are illustrated by different amounts of redundancy data 608a, 608b (i.e. different numbers of redundant bits) with second ECC encoder 606b providing more redundancy data 608b that is more than redundancy data 608a provided by first ECC encoder 606a. While output code words from first and second ECC encoders 606a-b are shown as the portion of data 602 combined with redundancy data 608a or 608b, this does not necessarily mean that redundancy data is simply appended to unencoded data (although this is an option). It will be understood that a portion of data may be transformed by an encoder so that the original bits are not provided as part of the output code word and that FIG. 6A shows the increased number of bits resulting from such a transformation.

First and second ECC encoders 606a-b may implement different types of ECC encoding schemes (e.g. one may use LDPC while another uses BCH) or may both use the same type of encoding scheme with different code rates (e.g. both may use LDPC but with different code rates). While FIG. 6A shows two ECC encoders 606a-b, any number of individual encoders may be combined with one or more code rate selectors to form a variable code rate encoder substantially as shown. In some cases, individual encoders may be implemented in the same hardware so that a single hardware block is reconfigured from a first code rate to a second code rate (or a third, fourth, or other code rate) as desired with a code rate selector selecting the configuration. In other cases, ECC encoders such as first and second ECC encoders 606a-b are implemented as separate hardware components.

Figure 6B:
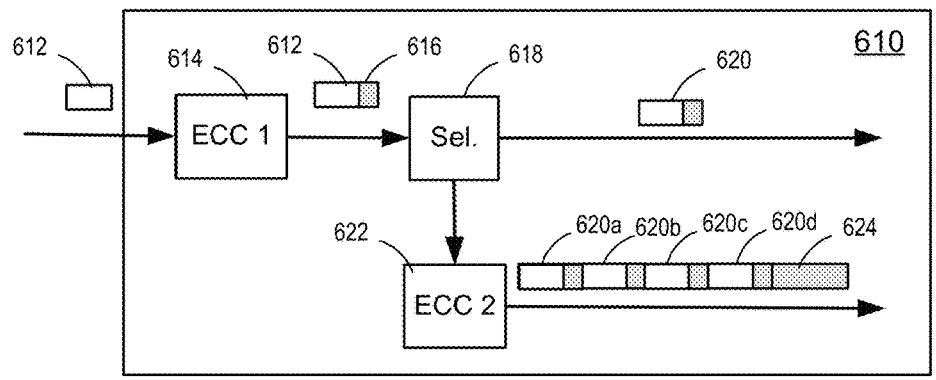

FIG. 6B shows another example of a variable code rate encoder 610 that may be used in a memory system. In this case, individual ECC encoders are arranged in series, with use of the second ECC encoder (or outer ECC encoder) being optional. A portion of data 612 is received by variable code rate encoder 610 and is encoded by a first ECC encoder 614. This results in a first code word that includes redundancy data 616 according to a first code rate. A code rate selector 618 selects whether to output code words from ECC encoder 614 directly, without additional encoding (e.g. first code word 620), or to perform further encoding. In this example, further encoding includes performing a second ECC encoding operation that extends over multiple first code words 620a-d from the first ECC encoder 614. A second ECC encoder 622 operates on a unit that consists of four first code words 620a-d in this example and produces a second code word with additional redundancy data 624 (i.e. additional redundancy data 624 is in addition to redundancy data 616 provided as part of first code words by first ECC encoder 614.

First ECC encoder 614 and second ECC encoder 622 may implement different types of ECC encoding schemes (e.g. one may use LDPC while another uses BCH) or may both use the same type of encoding scheme, with different individual code rates or the same code rates. Encoding in this arrangement may use the terms "inner" and "outer" to refer to the encoding by first ECC encoder 614 and second ECC encoder 622 respectively, with outer encoding being optional in this arrangement. While FIG. 6B shows first ECC encoder 614 and second ECC encoder 622 any number of individual encoders may be combined with one or more code rate selector to form a variable code rate encoder substantially as shown. For example, another ECC encoder may encode the output from second ECC encoder 622 to provide another layer of redundancy encoding. An appropriate number of such layers may be chosen according to requirements.

Aspects of FIGS. 6A-B may be combined so that individual encoders may be arranged both in parallel and series to provide multiple encoding options. For example, one or both of first ECC encoder 614 and second ECC encoder 622 of FIG. 6B may individually be variable code rate encoders (e.g. as shown in FIG. 6A to provide further code rate options).

Figure 6C:
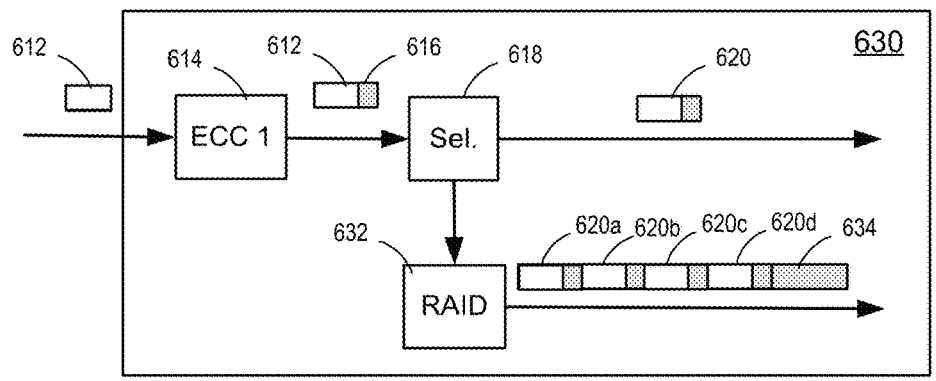

FIG. 6C shows another example of a variable code rate encoder 630 that includes a first and second encoders in an arrangement that is similar to FIG. 6B (similar numbering is used for similar components), but with second ECC encoder 622 replaced with a RAID encoder 632. In this case, first ECC encoder is arranged in series with a RAID encoder, with use of the RAID encoder being optional. A portion of data 612 is received by variable code rate encoder 630 and is encoded by first ECC encoder 614 as before. This results in a first code word that includes redundancy data 616 according to a first code rate. A code rate selector 618 selects whether to output code words from ECC encoder 614 directly, without additional encoding (e.g. first code word 620), or to perform further encoding. In this example, further encoding includes calculating (by a RAID encoder 632) redundant data 634 over multiple first code words 620a-d from the first ECC encoder 614 for storage in a RAID arrangement. For example, redundant data 634 may be stored in a separate physical location (different die, plane, block, or other unit) from first code words 620a-d in a striped arrangement, mirroring arrangement, or other arrangement according to a selected RAID scheme (e.g. RAID 0-10).

Aspects of FIGS. 6A-C may be combined so that ECC and RAID encoders may be arranged in various ways to provide multiple encoding options in a memory system. For example, ECC encoder 614 may be a variable code rate encoder (e.g. as shown in FIG. 6A, FIG. 6B or otherwise, to provide further code rate options). RAID encoder 632 may implement a single RAID scheme (e.g. RAID 4) or may be configurable to implement different RAID schemes (e.g. RAID 0-10) with different encoding rates.

While FIGS. 6A-C provide specific examples of redundancy encoders with variable code rates, it will be understood that aspects of the present technology may be implemented using a variety of different encoders implemented in hardware, firmware, programmable logic, or otherwise.

Redundancy encoding with different code rates allows data to be encoded in an adaptive manner that may more efficiently use available space in a memory. A relatively low code rate (relatively large amount of redundant data) may be used for some data while a relatively high data rate (relatively small amount of redundant data) may be used for other data. Selecting an appropriate code rate for a given portion of data may be based on various factors. To facilitate selection of appropriate code rates, a host may provide a memory system with information that is relevant to selection. This may include current information (e.g. whether there is a backup copy of the data to be encoded) and predictive indicators (e.g. how long the data is expected to be retained, what environmental conditions are expected during retention, how frequently the data is expected to be accessed). A host interface may be configured to receive such indicators within a command or otherwise.

Host Interface

Figure 7:
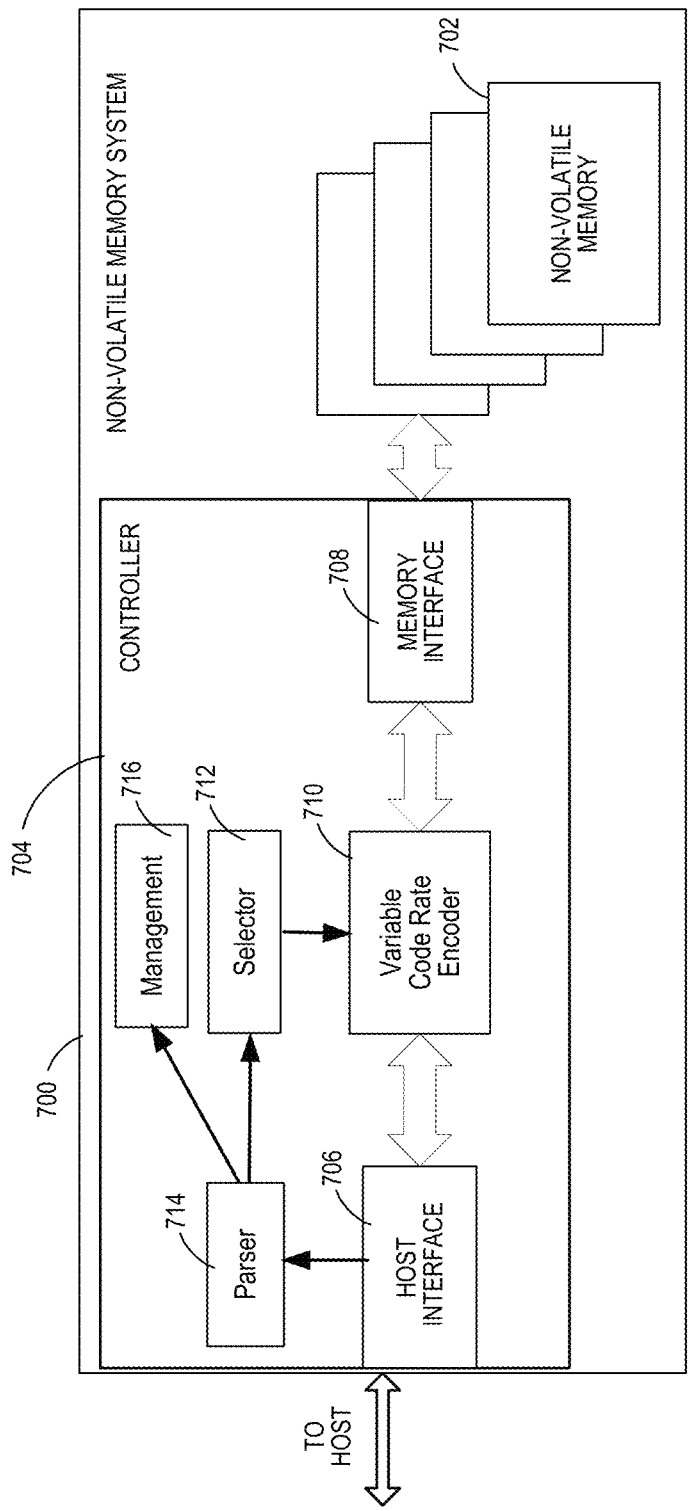
FIG. 7 illustrates an example of a non-volatile memory system with variable code rate encoding.

FIG. 7 shows an example of non-volatile memory system 700 that includes a variable code rate encoder, for example as previously described in any one of FIGS. 6A-C or otherwise. Non-volatile memory system 700 includes a non-volatile memory 702 (consisting of multiple memory dies as shown) and a controller 704. Controller 704 includes a host interface 706 for communication with a host (or hosts) and a memory interface 708 for communication with non-volatile memory 702. A variable code rate encoder 710 is in communication with host interface 706 and with memory interface 708 to encode data received from a host ("user data") through host interface 706 prior to sending it to memory interface 708 for storage in non-volatile memory 702. Variable code rate encoder 710 may be an encoder according to one or more of FIGS. 6A-C or another encoder that can selectively generate different amounts of redundant data for a given unit of received data. For any given portion of data encoded by variable code rate encoder 710 a code rate is selected by code rate selector 712. Code rate selector 712 may select appropriate code rates for different data from two or more code rates that can be implemented by variable code rate encoder 710. Variable code rate encoder 710 may be considered an example of means for encoding data with a selected code rate.

In one embodiment, code rates are selected by code rate selector 712 according to input received from a host. For example, a host may provide information to non-volatile memory system 700 that may be used in selecting an appropriate code rate. This information may be received with the data as part of a write command, or in another communication from the host. Command parser 714 is connected to host interface 706 to parse a command received from a host, such as a write command, to identify information sent with user data that may be used by non-volatile memory system 700. A host may send a range of information to a non-volatile memory system regarding user data some of which may be sent to a selector and used to select a code rate and some of which may be used for other data management decisions. FIG. 7 shows command parser 714 in communication with data management unit 716, which may select data management options according to information provided by a host. FIG. 7 shows command parser 714 connected to code rate selector 712 to provide indicators that code rate selector 712 may use to select an appropriate code rate. Specific examples of information provided by a host that may be used by code rate selector 712 and/or data management unit 716 are described below and include predictive indicators relating to expected conditions for storage of data. Thus, host interface 706 may be considered an example of means for receiving data and for receiving one or more predictive indicators relating to expected conditions for storage of the data in non-volatile memory cells. It will be understood that the present technology is not limited to any particular information or indicators, and that a broad range of information may be provided for a broad range of purposes.

Information provided by a host may include indicators of current conditions relevant to user data storage, and predictive indicators relating to the period of time that the data is expected to be stored in non-volatile memory. While current conditions may be known with certainty, there is generally some uncertainty regarding the future so that predictive indicators may not always be completely accurate. In some cases, an indicator of confidence may be sent with a predictive indicator and the indicator may be weighted accordingly.

One example of a predictive indicator that may be sent by a host and used by a non-volatile memory system to select a code rate for user data is an expected retention time for user data. In general, data that is stored in non-volatile memory degrades over time leading to data retention errors. Thus, the number of bad bits (i.e. bit error rate, or "BER") in stored data tends to increase over time. Where a host gives an indicator as to how long data may have to be retained in memory, this may help to select an appropriate code rate. Generally, data that is retained for a short period has fewer errors than data retained for a long period. Thus, knowing that particular data is to be retained for a short period may allow a high code rate (low redundancy) to be used (thereby saving space in memory). Knowing that particular data is to be retained for a long period may allow a low code rate (high redundancy) to be used (thereby providing extra protection for expected high number of data retention errors). In the absence of a predictive indicator from a host relating to expected data retention time, a default code rate may be used, which may be based on a worst-case scenario (e.g. a long data retention period) and thus may use more space in memory than if a code rate was selected according to an indicator of expected data retention time.

Selection of an appropriate code rate (e.g. by code rate selector 712) according to information from a host may be implanted in any suitable manner. For example, code rate selector 712 may select a code rate from predictive indicators and may be considered an example of means for identifying a code rate for the data from one or more predictive indicators. In one embodiment, a code rate selector uses one or more tables to identify an appropriate code rate according to one or more indicators provided by a host. Such a table may be part of the firmware of a non-volatile memory system and may be updated with the firmware. Thus, the correspondence between indicators from a host and code rates may be specific to different applications, different host systems, or other factors, according to firmware loaded in the non-volatile memory system.

FIG. 8A shows an example of a table that may be used by a non-volatile memory system such as non-volatile memory system 700 to select an appropriate code rate for user data. The left column shows expected data retention time and the right column shows corresponding code rates. For any given expected data retention time, a corresponding code rate may be obtained from FIG. 8A. Thus, for example, where a predictive indicator from a host indicates that data is to be retained for less than 1 hour, code rate A may be selected. Code rate A may be a high code rate because the number of data retention errors occurring in less than 1 hour should be small. If data is to be retained for more than 1 hour but less than 1 day, then code rate B is selected, which is a lower code rate than code rate A. If data is to be retained for more than 1 day but less than 1 month, then code rate C is selected, which is a lower code rate than code rate B. If data is to be retained for more than 1 month but less than 1 year, then code rate D is selected, which is a lower code rate than code rate C. If data is to be retained for longer than 1 year, then code rate E is selected, which is a lower code rate than code rate D. Thus, for longer expected data retention times, lower code rates are selected. For example, code rate A may be 0.96, code rate B may be 0.95, code rate C may be 0.94, code rate D may be 0.93, and code rate E may be 0.92. Expected data retention time may be provided using a limited number of ranges (e.g. the five shown in FIG. 8A) so that this data represents just a few bits of a host command. Expected retention times may be estimated by a host according to the type of data being stored and patterns of access to similar data. In some cases, expected data retention times or other predictive indicators may be generated by an operating system. In some cases, expected data retention times or other predictive indicators may be generated by applications that generate write commands. For example, browser cache data may be retained for relatively short periods (hours or days) and may not require the same code rate as data stored for longer periods. Thus, a browser may identify cache data with an expected (short) data retention time.

One example of a predictive indicator that may be sent by a host and used by a non-volatile memory system to select a code rate for user data is an indicator of one or more expected environmental conditions such as expected temperature range during a data retention period. In general, data that is stored in non-volatile memory degrades faster at when the read and write temperatures are very different leading to more data retention errors when data is stored in a non-volatile memory that is exposed to temperatures that are different to the temperature when written. Thus, the number of bad bits (i.e. bit error rate, or "BER") in stored data tends to increase faster at higher or lower temperature than the write temperature. Where a host gives an indicator as to what temperature range may be expected for a non-volatile memory during a period when data is stored, this may help to select an appropriate code rate. Furthermore, data that is stored (programmed and verified) at a first temperature and is subsequently read at a second temperature may have a higher BER than data that is programmed and read at the same temperature. Thus, temperature changes may be significant and temperature data may be provided with respect to the temperature when data was stored (i.e. as relative temperature rather than absolute temperature). For example, using a value: delta T=Twrite−Tread, where Twrite is the temperature of the non-volatile memory when the data is written and Tread is the temperature of the non-volatile memory when the data is read. The temperature difference may be either positive or negative (i.e. Tread may be less than or greater than Twrite). In some cases, positive and negative temperature differences may be treated differently. In the present example, they are treated the same (i.e. the magnitude of the delta T is used in the present example regardless of whether read temperature is higher or lower than write temperature). A value such as delta T may be provided by a host for individual components within a memory system such as for an individual non-volatile memory die, card, board, or other unit. In some memory systems, a memory system may be embedded in a host and may be at substantially the same temperature as host components so that expected host temperature may be used as expected non-volatile memory temperature. In other systems, a host and a memory system may experience different temperatures. In general, predictive indicators used to select code rates relate to temperature expected at the memory system, or specific components of the memory system, which may be different to temperature expected at a host. In the absence of a predictive indicator from a host relating to expected temperature, or temperature range to be experienced by a non-volatile memory system, a default code rate may be used, which may be based on a worst-case scenario (e.g. a high temperature difference between write temperature and read temperature) and thus may use more space in memory than if a code rate was selected according to expected temperature (e.g. if a non-volatile memory system knows that the temperature difference, delta T, will remain <30 C then it may use less than a default code rate to save space).

FIG. 8B shows an example of a table that may be used by a non-volatile memory system such as non-volatile memory system 700 to select an appropriate code rate for user data. The left column shows expected temperature difference ranges and the right column shows corresponding code rates. Temperature differences may be positive or negative (i.e. read temperature may be hotter or colder than write temperature). For any given temperature difference range, a corresponding code rate may be obtained from FIG. 8B. Thus, for example, where a predictive indicator from a host indicates that the non-volatile memory is expected to remain in a temperature difference range less than 30 degrees centigrade (<30 C temperature difference between write temperature Twrite and read temperature Tread), code rate A may be selected. Code rate A may be a high code rate because the number of data retention errors occurring in at such moderate temperature differences should be small. If data is to be stored in a non-volatile memory that is expected to experience less than 40 degrees centigrade (<40 C) differences between write and read temperatures, then code rate B is selected, which is a lower code rate than code rate A. If data is to be stored in a non-volatile memory that is expected to experience less than 50 degrees centigrade (<50 C) differences between write and read temperatures, then code rate C is selected, which is a lower code rate than code rate B. If data is to be stored in a non-volatile memory that is expected to experience more than 50 degrees centigrade differences between write and read temperatures, then code rate D is selected, which is a lower code rate than code rate C. Thus, for higher expected temperature difference ranges, lower code rates are selected. Expected temperature difference range may be provided using a limited number of ranges (e.g. the four shown in FIG. 8A) so that this data represents just a few bits of a host command. In general, the expected temperature difference range applies to the period of time during which the data is expected to be retained. Expected temperature, and/or temperature difference may be combined with expected retention time in a combined predictive indicator to indicate an expected cumulative effect of expected temperature and/or temperature difference over expected retention time. Expected temperature difference range or other environmental variables may be predicted by a host according to information available to the host from location or other information. For example, where a non-volatile memory is expected to be in a location with stable low temperatures such as an air-conditioned office building or other air-conditioned environment, a host may indicate a low expected temperature difference range to a non-volatile memory system to allow the non-volatile memory system to use a high code rate, thereby saving space in memory. Current GPS location of a non-volatile memory system, or other location information for the non-volatile memory system may be used by a host to predict future location and thus environmental conditions. Other environmental variables may similarly be indicated to a non-volatile memory where such variables may have an effect on stored data (e.g. expected magnetic or electric interference levels, radiation, or vibration).

One example of a predictive indicator that may be sent by a host and used by a non-volatile memory system to select a code rate for user data is an indicator of expected read frequency. In general, data that is stored in non-volatile memory degrades faster when it is read and/or when neighboring data is read, due to read disturb effects. Thus, the number of bad bits (i.e. bit error rate, or "BER") in stored data tends to be higher in data that is frequently read and/or is stored near data that is frequently read. Where a host gives an indicator as to expected read frequency during a period when data is stored, this may help to select an appropriate code rate. Thus, knowing that particular data is stored near data that is not expected to be read frequently may allow a high code rate (low redundancy) to be used (thereby saving space in memory). Knowing that particular data is stored near data that is expected to be frequently read may allow a low code rate (high redundancy) to be used (thereby providing extra protection for expected high number of data retention errors). In the absence of a predictive indicator from a host relating to expected read frequency, a default code rate may be used, which may be based on a worst-case scenario (e.g. a read frequency) and thus may use more space in memory than if a code rate was selected according to expected read frequency (e.g. if expected read frequency is low then a code rate less than a default code rate may be used). An indicator of expected read frequency may also be used to determine the frequency of a data refresh scheme (i.e. data stored near frequently read data may be refreshed more frequently). In some cases, data that is expected to be frequently read ("hot data") may be stored in separate physical areas from data that is not expected to be frequently read ("cold data") e.g. in separate blocks. Different Logical Block Address (LBA) ranges may be assigned to such hot and cold data which may allow faster access and may reduce the number of control reads.

FIG. 8C shows an example of a table that may be used by a non-volatile memory system such as memory system 700 to select an appropriate code rate for user data. The left column shows expected read frequency ranges and the right column shows corresponding code rates. For any given expected read frequency, a corresponding code rate may be obtained from FIG. 8C. Thus, for example, where a predictive indicator from a host indicates that the expected read frequency is low, code rate A may be selected. Code rate A may be a high code rate because the number of read disturb errors should be low according to the low expected read frequency. If data is expected to be read with medium frequency, then code rate B is selected, which is a lower code rate than code rate A. If data is expected to be read with high frequency, then code rate C is selected, which is a lower code rate than code rate B. Thus, for data that is expected to be frequently read, or stored close to data that is frequently read, lower code rates are selected. Expected read frequency may be indicated using a limited number of ranges (e.g. the three shown in FIG. 8C) so that this data represents just a few bits of a host command. Expected read frequency may be combined with expected temperature and/or retention time in a combined predictive indicator. Expected read frequency may be predicted by a host according to information available to the host from the nature of the data being stored, statistical analysis, or otherwise. For example, where data to be stored is a backup copy of data stored and primarily accessed elsewhere, expected read frequency may be low, while other data may include a lookup table that is expected to be accessed frequently by an application or operating system. A host may indicate a low read frequency to a non-volatile memory system to allow the non-volatile memory system to use a high code rate (e.g. higher than a default code rate), thereby saving space in memory.

In addition to predictive indicators such as those described above, a host may provide indicators of one or more present conditions. For example, the existence of another copy of data may be indicated to a non-volatile memory. A higher code rate may be used for data that is backed up elsewhere. For example, in a user device data that is backed up to the cloud may be stored in non-volatile memory in the user device with a lower code rate than data that is not backed up to the cloud. In addition to simply indicating whether data is backed up or not, a host may provide an indicator of the quality of access to a backup copy. In some cases, a backup copy may be easily accessed and there may be little delay in obtaining the data from backup. In other cases, a backup copy may take significant time and resources to obtain (e.g. there may be significant latency because data is stored in a manner optimized for cost rather than for rapid access). Simply knowing whether there is a backup or not may not provide sufficient information to identify an appropriate code rate.

FIG. 8D shows an example of a table that may be used by a non-volatile memory system such as memory system 700 to select an appropriate code rate for user data. The left column shows the quality of any backup copy and the right column shows corresponding code rates. For any given backup access level, a corresponding code rate may be obtained from FIG. 8D. Thus, for example, where an indicator from a host indicates that the backup access is good, code rate A may be selected. Code rate A may be a high code rate because the backup copy may be easily accessed. If access to a backup copy is at a medium level, then code rate B is selected, which is a lower code rate than code rate A. If access to a backup copy is poor, then code rate C is selected, which is a lower code rate than code rate B. If there is no backup copy, then code rate D is selected, which is a lower code rate than code rate C. Thus, for data with poor access, or no access, to a backup copy, lower code rates are selected. Backup access may be indicated using a limited number of ranges (e.g. the four shown in FIG. 8D) so that this data represents just a few bits of a host command. A host may indicate good backup access to a non-volatile memory system to allow the non-volatile memory system to use a high code rate (e.g. higher than a default code rate), thereby saving space in memory. Table 1 below illustrates an example using three different code rates (in the left column), with the last rate being a nominal or default rate of 0.9, which allows a BER of 1.50% to be corrected (supported BER in second column). Two higher code rates, 0.93 and 0.95 support BERs of 0.80% and 0.50% respectively.

TABLE 1

| Rate | Supported BER |
|---|---|
| 0.95 | 0.50% |
| 0.93 | 0.80% |
| 0.9 (Nominal) | 1.50% |

The tables of FIGS. 8A-D show different examples of how code rates may be selected based on different indicators. While these examples show each indicator having a separate table, it will be understood that these tables, and/or other tables for other indicators, may be combined into a larger table with multiple indicators. For example, a code rate may be chosen as the lowest necessary code rate based on two or more different indicators using a combined table, or otherwise. In some cases, a weighted table may be used so that some indicators may be given more importance than others when selecting a code rate. For example, where a backup copy is available with good access (see FIG. 8D) then other indicators may be ignored (given zero weighting) or substantially ignored (given low weighting) and a high code rate may be used.

While the above examples illustrate certain information that may be provided by a host to a non-volatile memory system, it will be understood that additional indicators and additional information may be provided and that the information may be used in a variety of ways. For example, in addition to using such information to identify an appropriate code rate, indicators from a host, including predictive indicators, may be used to manage data storage in other ways.

In an example, a data refresh scheme for particular data may be selected according to indicators provided by a host, including one or more of the indicators discussed above. For example, data that is expected to be frequently read and/or exposed to high temperature differences between read and write temperatures may be refreshed according to a refresh scheme that more frequently updates the data than data that is not expected to be frequently read and/or exposed to large temperature differences (or other factors). In an example, physical locations for storing data in a non-volatile memory may be chosen according to indicators provided by a host, including one or more of the indicators discussed above. For example, data with a short expected data retention time may be stored in a dedicated block that is used for short-term data. Data with low expected read frequency may be stored in a dedicated block that is used for such data (e.g. separate block for data expected to be infrequently read). In an example, data may be written in a manner that is selected according to indicators from a host. For example, data may be written with a number of bits per cell that depends on indicators, including one or more of the indicators discussed above. For example, data with a short expected data retention time may not be written with a high number of bits per cell because the time and resources needed for such programming may not be worthwhile for the short period of time the data is to be stored. Such data may be stored with one bit per cell in Single Level Cell (SLC) format. A memory controller may implement a variety of such adaptive schemes according to indicators provided by a host. For example, data management unit 716 of FIG. 7 may manage data according to one or more of the indicators discussed above (e.g. may act as a data refresher to apply different refresh schemes, and/or may store data in different physical locations (e.g. different blocks), and/or in different formats, or otherwise adapt data storage according to one or more indicators).

A host may provide indicators, including predictive indicators, to a non-volatile memory system in various ways. A protocol may allow various attributes to be sent by a host to a non-volatile memory system (e.g. command access size, information about sequential write or read commands, information about access such as expected latency and/or frequency) and may additionally include an indicator of expected data retention time, expected temperature differences (or other environmental conditions), expected read frequency, or other expected conditions. A host may send additional indicators such as an indicator of importance of particular data, or may require data to be maintained in cache in some cases. In some cases, logical addresses (e.g. Logical Block Addresses, or LBAs) may be associated with different data attributes so that a host may use LBA ranges to indicate that data has certain attributes and a non-volatile memory system may adapt how it treats the data accordingly (e.g. backed up data may be assigned to a LBA range while data that is not backed up is assigned to a different LBA range).

In some embodiments, space in memory may be saved by using appropriate code rates that are higher than nominal, or default code rates. (In other examples, additional space is required for data stored with code rates that are higher than nominal, or default code rates, or some combination may result in some data encoded with higher than nominal code rates and other data encoded with lower than nominal code rates.) Such saved space may be used in various ways including providing additional capacity for user data, providing storage space for memory controller data, or providing additional overprovisioning.

Overprovisioning

A non-volatile memory may have a nominal data capacity that is less than the total capacity of the physical memory array. The difference between the nominal capacity and the total capacity may be considered overprovisioning. In general, an appropriate level of overprovisioning is provided to facilitate memory management operations. For example, some overprovisioning may be needed to allow data to be moved during garbage collection or other operations. Insufficient overprovisioning may affect write speeds and may result in significant write amplification. Aspects of the technology described here may be used to increase overprovisioning in a non-volatile memory and thereby improve memory performance.

In order to take advantage of space saved by using high code rates for some data in a memory, data may be written in a manner that is different to data encoded using a uniform code rate. Uniform sized code words produced by a fixed code rate scheme may be stored in a memory in an aligned manner in pages that store a fixed number of code words per page. For example, a page may have a capacity that is an integer times the size of a code word. In one embodiment, one page of data includes all of the data bits of all of the memory cells in one sub-block connected to a common word line. In another embodiment, one page of data includes all of the data bits of all of the memory cells connected to a common word line. In another embodiment, each word line can store multiple pages within a sub-block. In another embodiment, each of multiple bits stored in a memory cell are in a different logical page. Other arrangements of pages can also be used.

Figure 9A:
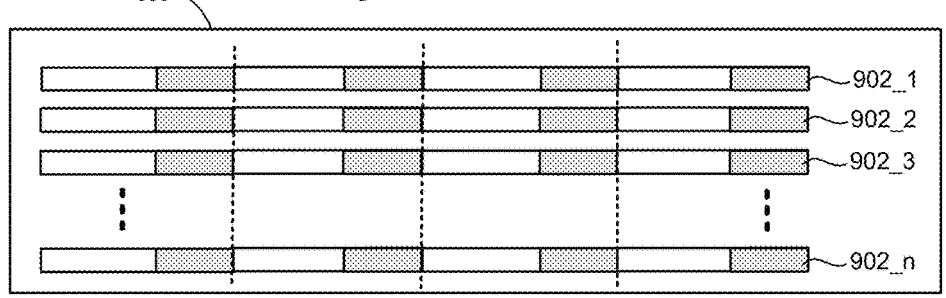
FIGS. 9A-C illustrate examples of storing encoded data.
Figure 9B:
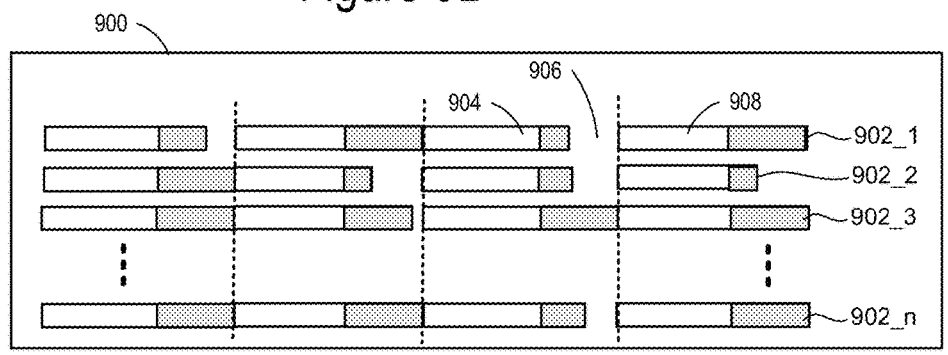
Figure 9C:
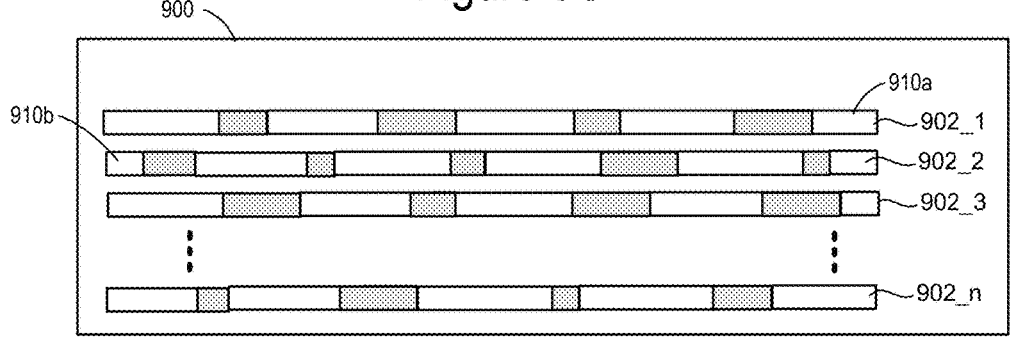

FIGS. 9A-C show examples of how data may be stored in a non-volatile memory system, e.g. non-volatile memory system 700 previously described. FIG. 9A shows an example of a portion of a non-volatile memory 900 containing code words of a default length arranged in pages 902_1-902_n. Each page 902_1-902_n contains four code words (e.g. each code word consists of 2 kB and each page has capacity of 8 kB). Dotted lines are drawn between code words and code words are shown including a shaded portion representing redundancy data as before. It can be seen that code words align from page to page (i.e. dotted lines are straight lines) because all code words have the same length (default length).

FIG. 9B shows an example of code words of variable-length stored in pages 902_1-902_n of non-volatile memory 900. Here, some code words are shorter than a nominal length (i.e. shorter than the code words shown in the example of FIG. 9A). For example, code word 904 has less redundancy data than the code words of FIG. 9A. This leaves a gap 906 between code word 904 and subsequent code word 908. In general, it is difficult to take advantage of such gaps within a page. Where a page is a minimum unit of writing data, sub-page writes may not be possible. Even if such writes are possible, managing small fragments written between code words in this way could present a significant burden.

FIG. 9C shows an example in which code words (of variable-length) are not aligned with pages. In this case, some code words are shorter than the example of FIG. 9A and code words, including the shorter code words, are written in pages without gaps. Accordingly, locations of boundaries between code words are not fixed and are not aligned from page to page. Furthermore, because code words do not align with pages, some code words wrap around from one page to another. For example, a portion 910a of a code word is in page 902_1 while another portion 910b of the code word is in page 902_2. Pages contain a non-integer number of variable-length code words in this example. For example, page 902_1 contains four complete pages and portion 910a that is a fraction of a code word (e.g. half a code word, or some other fraction). In general, writing code words of different sizes as shown to allow wrap around between pages efficiently uses available space and takes advantage of shorter code words. For example, the number of code words per block may be increased above a nominal number that would be provided if all code words were of a nominal size. This additional space may be consolidated so that it can be used and this space may be added to overprovisioning and may thus improve memory performance (e.g. by reducing write amplification).

Figure 10:
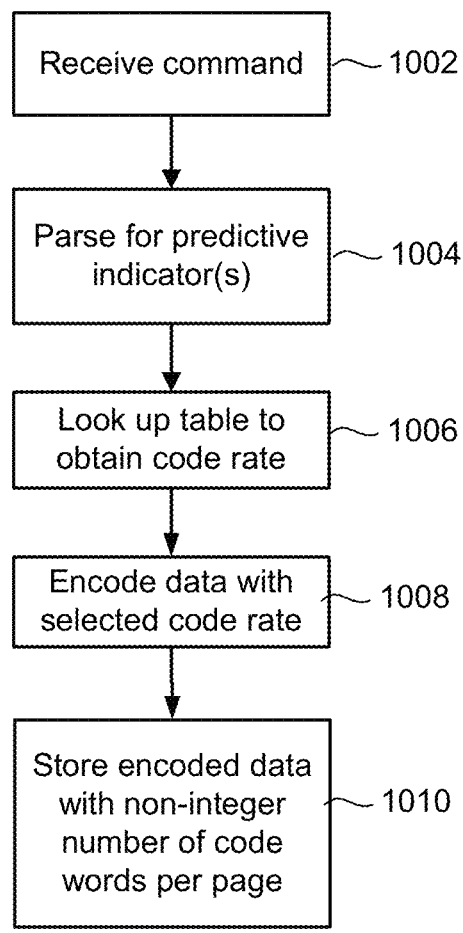
FIG. 10 illustrates an example of a method of encoding and storing data.

FIG. 10 illustrates a method of operating a non-volatile memory system (e.g. non-volatile memory system 700 previously described) according to an aspect of the present technology. A command is received 1002 (e.g. a host write command) by a non-volatile memory system. The command is parsed for predictive indicator(s) 1004. This may include extracting particular portions of the command, or comparing LBA ranges with predetermined ranges, or other examination of a received command to obtain one or more predictive indicators (and/or other indicators including, for example, a backup quality indicator). The indicators obtained are used to look up a table or tables to obtain a corresponding code rate 1006. Received data is then encoded with the corresponding code rate 1008. This may produce code words of different length, e.g. less than a nominal length. Encoded data is stored with a non-integer number of code words per page 1010. Such storage may allow saved space to be consolidated in one or more pages of a block where the space can be used by a memory controller as overprovisioning.

Figure 11:
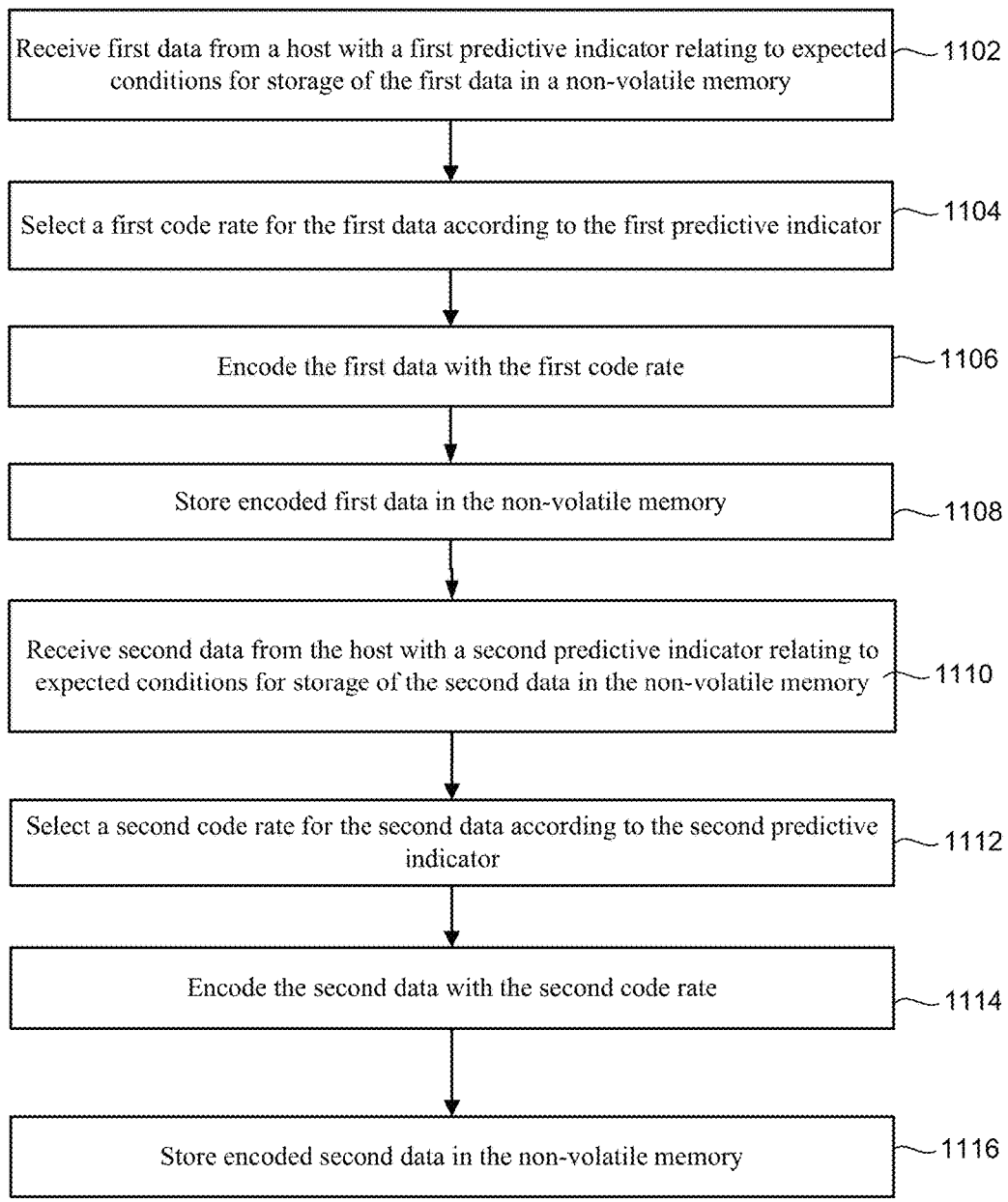
FIG. 11 illustrates an example of different encoding and storing of data.

FIG. 11 illustrates how two or more portions of data may be differently managed in a non-volatile memory system such as non-volatile memory system 700 described above. In a first step 1102, first data is received from a host with a first predictive indicator relating to expected conditions for storage of the first data in a non-volatile memory. For example, a write command may include predictive indicators such as expected retention time, expected temperature range during retention (e.g. as a temperature difference with respect to a write temperature), and/or expected read frequency. A first code rate is selected for the first data according to the first predictive indicator in step 1104. For example, the predictive indicator(s) may be used to look up a table to find a corresponding code rate. The first data is encoded with the first code rate in step 1106, and the encoded first data is stored in the non-volatile memory in step 1108. Second data from the host is received with a second predictive indicator relating to expected conditions for storage of the second data in the non-volatile memory in step 1110. For example, a second write command may include predictive indicators such as expected retention time, temperature range during retention, and/or expected read frequency that are different from the first write command. A second code rate is selected for the second data according to the second predictive indicator in step 1112. For example, the predictive indicator may be used to look up a table or tables to find a corresponding code rate. The second data is encoded with the second code rate in step 1114, and the encoded second data is stored in the non-volatile memory in step 1116. Thus, data is encoded using first and second code rates resulting in code words of different lengths.

One embodiment includes a non-volatile storage apparatus, comprising: a set of non-volatile memory cells; one or more control circuits in communication with the set of non-volatile memory cells, the one or more control circuits are configured to encode data with a code rate, the code rate selected from two or more code rates according to one or more predictive indicators received with the data, the one or more predictive indicators relating to expected conditions for data storage of the data in the set of non-volatile memory cells.

The one or more predictive indicators may include an indicator of one or more expected environmental conditions. The one or more expected environmental conditions may include expected temperature and the one or more control circuits may be configured to select a high code rate for data that is expected to experience temperature within a temperature range. The one or more predictive indicators may include an indicator of expected data retention time. The one or more control circuits may be configured to select a high code rate for data with a short expected data retention time. The one or more predictive indicators may include an indicator of expected read frequency. The one or more control circuits may be configured to select a high code rate for data with a low expected read frequency. The code rate may be selected according to one or more additional indicators in addition to the one or more predictive indicators, the one or more additional indicators including an indicator that a copy of the data is available at a location outside the non-volatile storage apparatus. The one or more control circuits may be configured to select the code rate according to a table that links the one or more predictive indicators with the two or more code rates. The set of non-volatile memory cells may be arranged in pages, where a page is a unit of programming; and the one or more control circuits may be configured to encode data with a variable code rate to generate encoded data in variable-length code words that are written in the non-volatile memory such that one or more pages contain a non-integer number of variable-length code words. The variable-length code words may include a first number of code words of a default length that are encoded with a default code rate and a second number of code words shorter than the default length that are encoded with a code rate, or rates, lower than the default code rate, a nominal capacity of the non-volatile storage apparatus may be based on the default code rate, and space saved by the second number of code words shorter the default length may add overprovisioning.

One embodiment includes an apparatus, comprising: a first communication interface configured to communicate with a host; a second communication interface configured to communicate with one or more non-volatile memory dies; one or more redundancy encoders in communication with the first communication interface and the second communication interface, the one or more redundancy encoders configured to encode data received through the first communication interface for sending through the second communication interface, the one or more redundancy encoders configured to encode data using a code rate selected from two or more code rates; and a code rate selector that selects the code rate for encoding a portion of data according to one or more predictive indicators received through the first communication interface, the one or more predictive indicators relating to expected conditions for data storage of the portion of data in the one or more non-volatile memory dies.

The one or more predictive indicators may include at least one of: an indicator of an expected environmental condition; an indicator of expected data retention time; and an indicator of expected read frequency. The apparatus may further include a command parser configured to parse a command received through the first communication interface, to extract the one or more predictive indicators from the command, and to provide the one or more predictive indicators to the code rate selector. The apparatus may further include a data refresher in communication with the second communication interface, the data refresher configured to initiate refreshing of the portion of data in the one or more non-volatile memory dies according to the one or more predictive indicators.

One embodiment includes a method of programming a non-volatile storage system, comprising: receiving first data from a host with a first predictive indicator relating to expected conditions for storage of the first data in a non-volatile memory; selecting a first code rate for the first data according to the first predictive indicator; encoding the first data with the first code rate; storing encoded first data in the non-volatile memory; receiving second data from the host with a second predictive indicator relating to expected conditions for storage of the second data in the non-volatile memory; selecting a second code rate for the second data according to the second predictive indicator; encoding the second data with the second code rate; and storing encoded second data in the non-volatile memory.

The first code rate may generate code words of a first size, and encoded first data may be stored with an integer number of code words of the first size occupying a page in the non-volatile memory; and the second code rate may generate code words of a second size, and encoded second data may be stored with a non-integer number of code words of the second size occupying a page in the non-volatile memory. Selecting the first code rate for the first data according to the first predictive indicator may include obtaining the first code rate from a table that links a plurality of predictive indicators to code rates; and selecting the second code rate for the second data according to the second predictive indicator may include obtaining the second code rate from the table. The plurality of predictive indicators may include at least one of: an indicator of an expected environmental condition, an indicator of expected data retention time, and an indicator of expected read frequency.

One embodiment includes a non-volatile storage apparatus, comprising: a monolithic three-dimensional memory structure comprising non-volatile memory cells; means for receiving data and for receiving one or more predictive indicators relating to expected conditions for storage of the data in the non-volatile memory cells; means for identifying a code rate for the data from the one or more predictive indicators; and means for encoding the data with the code rate.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more other parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a set of non-volatile memory cells; and
one or more control circuits in communication with the set of non-volatile memory cells, the one or more control circuits are configured to encode data with a code rate prior to storage in the set of non-volatile memory cells, the code rate selected from two or more code rates including at least a first code rate and a second code rate that is higher than the first code rate according to one or more predictive indicators received with the data, the one or more predictive indicators relating to expected conditions for storage of the data in the set of non-volatile memory cells, a nominal capacity of the non-volatile storage apparatus is based on the first code rate and space saved by encoding at the second code rate adds overprovisioning.

2. A non-volatile storage apparatus according to claim 1, wherein:
the one or more predictive indicators include an indicator of one or more expected environmental conditions experienced by the set of non-volatile memory cells.

3. A non-volatile storage apparatus according to claim 2, wherein:
the one or more expected environmental conditions include expected temperature difference from write temperature and the one or more control circuits are configured to select a high code rate for data that is expected to experience temperature difference within a temperature range.

4. A non-volatile storage apparatus according to claim 3, wherein:
the one or more predictive indicators include an indicator of expected data retention time.

5. A non-volatile storage apparatus according to claim 3, wherein:
the one or more control circuits are configured to select a high code rate for data with a short expected data retention time.

6. A non-volatile storage apparatus according to claim 1, wherein:
the one or more predictive indicators include an indicator of expected read frequency.

7. A non-volatile storage apparatus according to claim 6, wherein:
the one or more control circuits are configured to select a high code rate for data stored in the set of non-volatile memory cells near other data that has a low expected read frequency indicated by the indicator of expected read frequency.

8. A non-volatile storage apparatus according to claim 1, wherein:
the code rate is selected according to one or more additional indicators in addition to the one or more predictive indicators, the one or more additional indicators including an indicator that a copy of the data is available at a location outside the non-volatile storage apparatus.

9. A non-volatile storage apparatus according to claim 1, wherein:
the one or more control circuits are configured to select the code rate according to a table that links the one or more predictive indicators with the two or more code rates.

10. A non-volatile storage apparatus according to claim 1, wherein:
the set of non-volatile memory cells is arranged in pages, where a page is a unit of programming; and
the one or more control circuits are configured to encode data with a variable code rate to generate encoded data in variable-length code words and further configured to write the variable-length code words such that one or more pages contain a non-integer number of variable-length code words.

11. An apparatus, comprising:
a first communication interface configured to communicate with a host;
a second communication interface configured to communicate with one or more non-volatile memory dies;
one or more redundancy encoders in communication with the first communication interface and the second communication interface, the one or more redundancy encoders configured to encode data received through the first communication interface for sending through the second communication interface, the one or more redundancy encoders configured to encode data using a code rate selected from two or more code rates; and
a code rate selector that selects the code rate for encoding a portion of data according to an indicator of expected data retention time of the portion of data, the indicator received in a host write command with the portion of data through the first communication interface, the indicator of expected data retention time estimated by the host according to the type of data.

12. An apparatus according to claim 11, wherein:
the type of data is browser cache data, the data retention time is short, and the selected code rate is high.

13. An apparatus according to claim 11, further comprising:
a command parser configured to parse a command received through the first communication interface, to extract the one or more predictive indicators from the command, and to provide the one or more predictive indicators to the code rate selector.

14. An apparatus according to claim 11, further comprising:

a data refresher in communication with the second communication interface, the data refresher configured to initiate refreshing of the portion of data in the one or more non-volatile memory dies according to the one or more predictive indicators.

15. An apparatus according to claim 11, wherein the indicator is a combined indicator that further includes expected temperature throughout the expected data retention time.

16. A method of programming a non-volatile storage system that has a nominal capacity based on a first code rate, comprising:
   receiving first data from a host with a first predictive indicator relating to expected conditions for storage of the first data in a non-volatile memory;
   selecting the first code rate for the first data according to the first predictive indicator;
   encoding the first data with the first code rate;
   storing encoded first data in the non-volatile memory;
   receiving second data from the host with a second predictive indicator relating to expected conditions for storage of the second data in the non-volatile memory;
   selecting a second code rate for the second data according to the second predictive indicator, the second code rate is higher than the first code rate;
   encoding the second data with the second code rate;
   storing encoded second data in the non-volatile memory; and
   adding space saved by encoding the second data at the second code rate to overprovisioning.

17. A method according to claim 16, wherein:
   the first code rate generates code words of a first size, and encoded first data is stored with an integer number of code words of the first size occupying a page in the non-volatile memory; and
   the second code rate generates code words of a second size, and encoded second data is stored with a non-integer number of code words of the second size occupying a page in the non-volatile memory.

18. A method according to claim 16, wherein:
   selecting the first code rate for the first data according to the first predictive indicator includes obtaining the first code rate from a table that links a plurality of predictive indicators to code rates; and
   selecting the second code rate for the second data according to the second predictive indicator includes obtaining the second code rate from the table.

19. A method according to claim 18, wherein:
   the plurality of predictive indicators include at least one of: an indicator of an expected environmental condition, an indicator of expected data retention time, and an indicator of expected read frequency.

20. A non-volatile storage apparatus, comprising:
   a monolithic three-dimensional memory structure comprising non-volatile memory cells;
   means for receiving data in a host write command and for receiving in the host write command one or more predictive indicators relating to expected data retention time of the data in the non-volatile memory cells, the one or more predictive indicators of expected data retention time estimated by the host according to the type of data;
   means for identifying a code rate for the data from the one or more predictive indicators; and
   means for encoding the data with the code rate.

* * * * *